(12) United States Patent
Chen et al.

(10) Patent No.: US 12,740,025 B2
(45) Date of Patent: Sep. 15, 2026

(54) SYSTEM FOR THE REUSE OF HEAT IN A DATA CENTER

(71) Applicant: Advanced Liquid Cooling Technologies Inc., Anderson, SC (US)

(72) Inventors: Nan Chen, Alpharetta, GA (US); Yunshui Chen, Greer, SC (US)

(73) Assignee: Advanced Liquid Cooling Technologies Inc., Anderson, SC (US)

( * ) Notice: Subject to any disclaimer, the term of this patent is extended or adjusted under 35 U.S.C. 154(b) by 117 days.

(21) Appl. No.: 18/419,330

(22) Filed: Jan. 22, 2024

(65) Prior Publication Data

US 2024/0164065 A1 May 16, 2024

Related U.S. Application Data

(63) Continuation-in-part of application No. 17/880,866, filed on Aug. 4, 2022, now Pat. No. 11,903,171.

(Continued)

(51) Int. Cl.
*H05K 7/20* (2006.01)

(52) U.S. Cl.
CPC ..... *H05K 7/20809* (2013.01); *H05K 7/20309* (2013.01); *H05K 7/20318* (2013.01)

(58) Field of Classification Search
CPC ........... H05K 7/20809; H05K 7/20309; H05K 7/20318; H05K 7/20345; H05K 7/20827;

(Continued)

(56) References Cited

U.S. PATENT DOCUMENTS 4,439,994 A 4/1984 Briley
5,307,642 A * 5/1994 Dean ...................... F25D 16/00 62/332

(Continued)

FOREIGN PATENT DOCUMENTS

CN 105928235 A * 9/2016 ................ F25B 6/02
CN 106288515 A 1/2017

(Continued)

OTHER PUBLICATIONS

International Search Report and Written Opinion for International Application No. PCT/US2024/033297, mailed Dec. 9, 2024, 6 pages.

*Primary Examiner* — Emmanuel E Duke
(74) *Attorney, Agent, or Firm* — Nutter McClennen & Fish LLP

(57) ABSTRACT

A thermal management system for a data center may include a thermal storage tank, a data center cooling loop, and an active stabilizer. The thermal storage tank is configured to maintain a stable operating temperature of a liquid coolant in response to variations between heat provided from the data center and a cooling demand. The thermal storage tank includes a passive stabilizer configured to absorb an amount of temperature fluctuation of the liquid coolant. The data center cooling loop is coupled to the data center and the thermal storage tank and configured to deliver heated data center coolant to the thermal storage tank and deliver cooled data center coolant to the data center. The active stabilizer is coupled to the thermal storage tank and configured to modify the liquid coolant to a modified temperature meeting a stabilization requirement.

20 Claims, 17 Drawing Sheets

Related U.S. Application Data

(60) Provisional application No. 63/622,804, filed on Jan. 19, 2024, provisional application No. 63/229,821, filed on Aug. 5, 2021.

(58) Field of Classification Search
CPC ........... H05K 7/20836; H05K 7/20818; H05K 5/0211
See application file for complete search history.

(56) References Cited

U.S. PATENT DOCUMENTS

| | | | | |
|---|---|---|---|---|
| 6,006,541 | A | 12/1999 | Taylor | |
| 2017/0074538 | A1* | 3/2017 | Marchetti | F24F 11/62 |
| 2018/0073753 | A1* | 3/2018 | LePoudre | F24F 12/002 |
| 2019/0113247 | A1* | 4/2019 | Lepoudre | F24F 5/0035 |
| 2020/0017741 | A1 | 1/2020 | Novek | |
| 2022/0252357 | A1* | 8/2022 | Alley | F24F 12/00 |

FOREIGN PATENT DOCUMENTS

| | | | | | |
|---|---|---|---|---|---|
| CN | 207395061 | U | * | 5/2018 | |
| CN | 105928235 | B | * | 8/2018 | F25B 49/02 |
| GB | 2247072 | A | | 2/1992 | |
| WO | WO-9417344 | A1 | * | 8/1994 | F25B 41/24 |

* cited by examiner

SYSTEM FOR THE REUSE OF HEAT IN A DATA CENTER

CROSS-REFERENCE TO RELATED APPLICATIONS

The present continuation-in-part patent application claims priority benefit under 35 U.S.C. 120 of the U.S. nonprovisional patent application Ser. No. 17/880,866 entitled "System for Modular Liquid Spray Cooling of Electronic Devices" filed on 4 Aug. 2022 (now U.S. Pat. No. 11,903,171, issued on 13 Feb. 2024), and further claims priority benefit of the U.S. provisional application for patent Ser. No. 63/229,821 entitled "Modular liquid spray cooling cell of electronic devices", filed on 5 Aug. 2021 under 35 U.S.C. 119(e). The present CIP application further claims priority benefit of the U.S. provisional application for patent Ser. No. 63/622,804 entitled "DATA CENTER HEAT REUSE SYSTEM", filed on 19 Jan. 2024 under 35 U.S.C. 119(e). The contents of these related applications are incorporated herein by reference for all purposes to the extent that such subject matter is not inconsistent herewith or limiting hereof.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection by the author thereof. The copyright owner has no objection to the facsimile reproduction by anyone of the patent document or patent disclosure for the purposes of referencing as patent prior art, as it appears in the Patent and Trademark Office, patent file or records, but otherwise reserves all copyright rights whatsoever.

BACKGROUND OF THE RELEVANT PRIOR ART

One or more embodiments of the invention generally relate to cooling systems. More particularly, certain embodiments of the invention relate to cooling systems for electronic devices incorporating the reuse of heat within a data center.

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon. IT equipment technology change has often been a primary driver in the development of infrastructure cooling solutions. Although liquid cooling has been deployed for many years in mainframes and high-performance computing (HPC), today's demands of cloud, IoT, AI, and edge applications are once again resulting in IT technology changes and driving a renewed look at liquid cooling and the development of new technologies. Increasing focus on data center energy efficiency and sustainability is also placing increased pressure on the data center industry to develop and adopt efficient cooling infrastructure like liquid cooling.

The predominate way to remove heat from IT equipment is by airflow through the chassis of the equipment. For typical servers, 70-80% of the heat is generated by the CPU, with the remaining heat from peripherals like memory, power supply, hard drives, SSD, etc. The increasing use of Graphics Processing Units (GPUs) has further increased the heat generated within the IT chassis. A GPU can generate over 400 watts, but high core count CPUs, like the latest Intel Xeon processor are now also generating 400 watts. Liquids have a much greater capacity to capture heat by unit volume. This allows liquid cooling technologies to remove heat more efficiently than air cooling and may enable the chips to work harder (i.e., increased clock speed). Additionally, the heat may be rejected to the atmosphere either via dry coolers or, in the case of hotter environments, cooling towers. In some systems the heat may be reused elsewhere such as district heating.

Liquid cooling is not new to data center applications. It can be traced back to the 1960s when it was used in IBM mainframes to solve the cooling challenges for solid state devices which were densely packed and had lower allowable operating temperatures. However, the introduction of complementary metal oxide semiconductor (CMOS) technology in the early 1990s replaced bipolar semiconductor technology, which reduced power consumption. As a result, convective airflow cooling again became the default cooling option for IT equipment. Convective airflow cooling is still dominant in data centers, but there is broader adoption of liquid cooling in gaming, blockchain mining, and HPC applications, which typically require greater compute capacity with special servers. Liquid cooling has not seen broader adoption across the data center industry, largely because the computer demand has been met with increasing the number of logical cores that stay within reasonable power limits.

There are two main categories of liquid cooling—direct to chip (sometimes called conductive or cold plate) and immersive. From these two categories come a total of five main liquid cooling methods, single-phase direct to chip liquid cooling where the coolant does not undergo a phase change, two-phase direct to chip liquid cooling where the coolant changes from one state to another (e.g., from liquid to gas), single-phase immersive liquid cooling within the IT chassis, single-phase immersive liquid cooling within a tub, and two-phase immersive liquid cooling within a tub. Direct to chip is where the liquid coolant is in contact with the hotter components (CPUs or GPUs) through a cold plate on the components within the server. The electronic components of the IT are not in direct physical contact with the liquid coolant. Some designs also include cold plates around memory modules. With this method, fans are still required to provide airflow through the server to remove residual heat. In single-phase direct to chip applications, the fluid does not change state while removing the heat. For single-phase direct to chip cooling, mainly single-phase water-based coolants are used, but some designs may use engineered dielectric fluids. In two-phase direct to chip liquid cooling the fluid used as the liquid coolant is two-phase which means the fluid changes from one state to another (e.g., from liquid to gas) when removing the heat. Two-phase is typically better than single-phase in terms of heat rejection; however two-phase may require additional system controls to ensure proper operation. For two-phase direct to chip liquid cooling, engineered dielectric fluid is typically used as the coolant. This eliminates the risk of water exposure to the IT equipment. The dielectric vapor present after the fluid goes through phase change can be transported to a condenser outside or reject its heat to a building water loop. With immersive liquid cooling, the liquid coolant is in direct physical contact with the IT electronic components. The servers are fully or partially immersed in a dielectric liquid coolant covering the board and the components, which typically ensures all sources of heat are removed. This approach uses a single-phase dielectric. With immersive liquid cooling, all fans within the server can be removed, and all electronics are placed in an environment which is inherently slow to react to any external changes in temperature and renders it immune to the influence of humidity and pollutants. Heat exchangers and pumps can be located inside of the server or in a side arrangement where the heat is transferred from the dielectric coolant to a water loop. With the tub method, also referred to as open bath, the IT equipment is completely submerged in the fluid. With traditional IT racks, the servers are typically horizontally stacked from the bottom to the top of a rack. However, because this method uses a tub, it is like laying a traditional rack of servers on its back. Instead of pulling servers out on a horizonal plane, tub immersive servers are pulled up and out on a vertical plane. Many times, this method incorporates centralized power supplies to provide power to all the servers within the tub. The heat within the dielectric fluid is transferred to a water loop via a heat exchanger using a pump or natural convection. This method typically uses oil-based dielectric as the fluid. Note that the heat exchanger may be installed inside or outside the tub. In a two-phase tub method, the IT is completely submerged in the fluid. The difference between a single-phase tub method and this method is the two-phase dielectric coolant. Again, this means the fluid changes from one state to another in removing the heat. For example, the servers may be submerged in the dielectric coolant in a liquid phase. As the heat from the servers is absorbed by the dielectric coolant, the temperature of the coolant increases until it changes into a vapor (i.e., boils). The vaporized coolant rises to the upper portion of the tub where it condenses back into a liquid phase and drips back down into the reservoir of liquid coolant.

Regarding the aforementioned cooling methods, the focus of conventional liquid immersive methods was put on the general and coarse results of liquid cooling instead of how the IT device could be cooled more efficiently. One thing that has been usually ignored is the direction of travel of the coolant as it approaches the heat sink. FIG. 1 is a perspective view of an exemplary heat sink designed for air cooling. This heat sink was optimized for maximum thermal performance at a certain direction of air flow, as indicated by the arrow in the drawing, and in general electronic devices like servers and miners in a computing system are designed for the best thermal performance at the same flow direction as that through heat sinks.

By way of educational background, another aspect of the prior art generally useful to be aware of is that there are many different liquid cooling solutions available on the market. The following focuses on current solutions relevant to spray cooling, which is an improved version of conventional immersion cooling technology wherein liquid coolant is sprayed onto heat generating components of a computing system and/or onto heat sinks in contact with the heat generating components. It has been found and published in many articles that the direct spray of liquid coolant has a higher heat rejection capacity under certain conditions when compared to other conventional cooling methods. Some current cooling systems focusing on the liquid spray cooling of computer servers utilize the original heat sinks of heat sources (CPU), which are generally designed for air cooling. The direction of liquid spraying (from top to bottom) is perpendicular to the typical horizontal flow direction of air for cooling in computer servers, refer to FIG. 1. The liquid is pushed out of a spray chamber through the holes onto to the targeted heat sources as a liquid beam. The free liquid heated by heat sources is then collected in the base cabinet and drained/suctioned out of the base cabinet. It is believed that because the vertical streams of the liquid are being sprayed onto horizontally oriented heat sources and heat sinks, it may be difficult to drain the dielectric liquid completely from the components. Any trapped dielectric liquid on the motherboard and components may work as an insulation layer to create potential hotspots within the server. Other current cooling systems utilize redesigned heat sinks made for liquid cooling applications that may be attached to the tops of the heat sources. The horizontal design of some such redesigned heat sinks may allow for the liquid to collect between the fins and act as an insulation layer to hinder the heat rejection. Other redesigned heat sinks are configured to enable liquid to be flushed through the fins of the heat sink and then drained out of the heat sink freely after absorbing the heat from heat sources. The hot liquid leaving the heat sinks is freely drained to the mother board or other components to be collected in the cabinet and suctioned out by a circulation pump. The free liquid on mother board and other components may be difficult to be drained away regarding the horizontal layout of servers and may act as an insulation layer to hinder the heat rejection.

Another type of high heat density equipment that has largely been ignored by existing cooling solutions are cryptocurrency miners. Some miner models have much higher thermal density than computer servers. Although the immersive liquid cooling-tub could cool the miner better than air cooled technology, the need for a larger liquid charging quantity because the miner typically needs to be fully submerged in the liquid and low heat transferring efficiency through the mode of natural convection have restricted the application of liquid cooling-tub technology.

One of the biggest complaints lodged against data centers is that they're energy hogs. However, now the trend points toward waste heat utilization. New concepts, such as, but not limited to, energy reuse effectiveness (ERE), have allowed data centers to be energy suppliers, not just users. Data centers have already made sustainability advancements in the last decades with significant reductions in both power usage effectiveness (PUE) and water usage effectiveness (WUE). Therefore, waste heat utilization is one more important step for data center operators to reach a future net-zero energy goal. Waste heat recovery from data centers is not only an emerging trend, but also already being encouraged, and in some cases, mandated by governments. Unfortunately, not all current data centers employ cooling technologies that can best optimize this trend.

Furthermore, not all data center cooling systems are conducive or efficient enough to extract the most waste energy with minimal thermal losses. Air cooling, for example, isn't as efficient as liquid cooling for waste heat recovery. Liquids transfer energy 10 times more efficiently than air. Therefore, liquid cooling is typically a better methodology than air cooling because its design inherently incorporates a chilled water loop for which to recover heat. Direct evaporative cooling and other technologies often use air distribution into the data center which isn't as efficient for waste heat recovery. Furthermore, existing data centers with air cooling are discovering difficulties tapping into the waste heat recovery trend, via direct or indirect evaporative cooling, because most of those systems require costly equipment add-ons, such as, but not limited to, heat recovery coils and hydropic loops. Additionally, heat recovery coils typically also require powered fans, which may further degrade overall data center efficiency.

By way of educational background, another aspect of the prior art generally useful to be aware of is that there are some current publications describing the idea of heat reuse in a data center. One such described solution includes a heat exchanger, an absorption chiller used to provide cooling based on the heat from the data center, and other accessories. Liquid-cooled cabinets described in this solution generally cannot provide stable heat output, which is the compulsory condition for the normal operation of an absorption refrigerator. Another current idea involves integrating the absorption cycle with the data center heat reuse, wherein the hot fluid out of the data center is pumped in the direction of the generator directly to work as the heat source of the absorption chiller. After the absorption circulation, the cold fluid out of the absorber can provide the cooling capacity for a comfort space. It is believed that this idea has not considered the temperature fluctuation of output fluid from the data center hasn't been considered, which will likely negatively affect the reliability and performance of absorption. Yet another approach discloses using a chiller as a booster to elevate the temperature grade out of the data center to be reused in the heat engine. Even though this concept can be realized in the real world, it is thought that the capital investment and running cost would be much higher due to the anticipated low efficiency of the chiller and heat engine. A further current approach describes extracting and collecting the heat from the computer server(s) to be used as the thermal source of a thermal engine. It is believed that the temperature/grade of waste heat in most cases would not be high enough to be reused for electricity generation, and the efficiency of the electricity generation would be too low to work as a cost-effective solution for energy recovery.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2A is a side perspective view of the liquid cooling cell. FIG. 2B is a partially transparent view of the liquid cooling cell. FIG. 2C is a side perspective view of a coolant circulation system within the liquid cooling cell. FIG. 2D is a side perspective view of a spray cooling mechanism. FIG. 2E is a front view of the spray cooling mechanism, and FIG. 2F is a schematic diagram of the thermal management system;

FIG. 3A is a bottom view, and FIG. 3B is a side view;

FIG. 4A shows a nozzle with a pneumatic atomization spray pattern, FIG. 4B shows a nozzle with an axial-flow, hollow cone spray pattern. FIG. 4C shows a nozzle with a tangential-flow hollow cone spray pattern. FIG. 4D shows a nozzle with a full cone spray pattern. FIG. 4E shows a nozzle with a solid stream/tank cleaning spray pattern, and FIG. 4F shows a nozzle with a flat fan spray patter;

FIG. 5A is a partially transparent side perspective view of the thermal management system. FIG. 5B is a side perspective view of a coolant circulation system within the thermal management system, and FIG. 5C is a front view of the spray cooling mechanism;

FIG. 6A is a partially transparent side perspective view of the thermal management system. FIG. 6B is a side perspective view of a coolant circulation system within the thermal management system. FIG. 6C is a front view of the spray cooling mechanism, and FIG. 6D is a bottom view of an exemplary sprayer 6011;

FIG. 7A is a partially transparent side perspective view of the thermal management system. FIG. 7B is a side perspective view of a spraying subsystem within the thermal management system. FIG. 7C is a side view of the spraying subsystem, and FIG. 7D is a front view of the spray cooling mechanism;

FIG. 8A is a partially transparent side perspective view of the thermal management system. FIG. 8B is a side perspective view of a coolant circulation system within the thermal management system, and FIG. 8C is a bottom view of an exemplary sprayer;

FIG. 11A is a cross-sectional side view, and FIG. 11B is a top view of a distributor.

Figure 1:
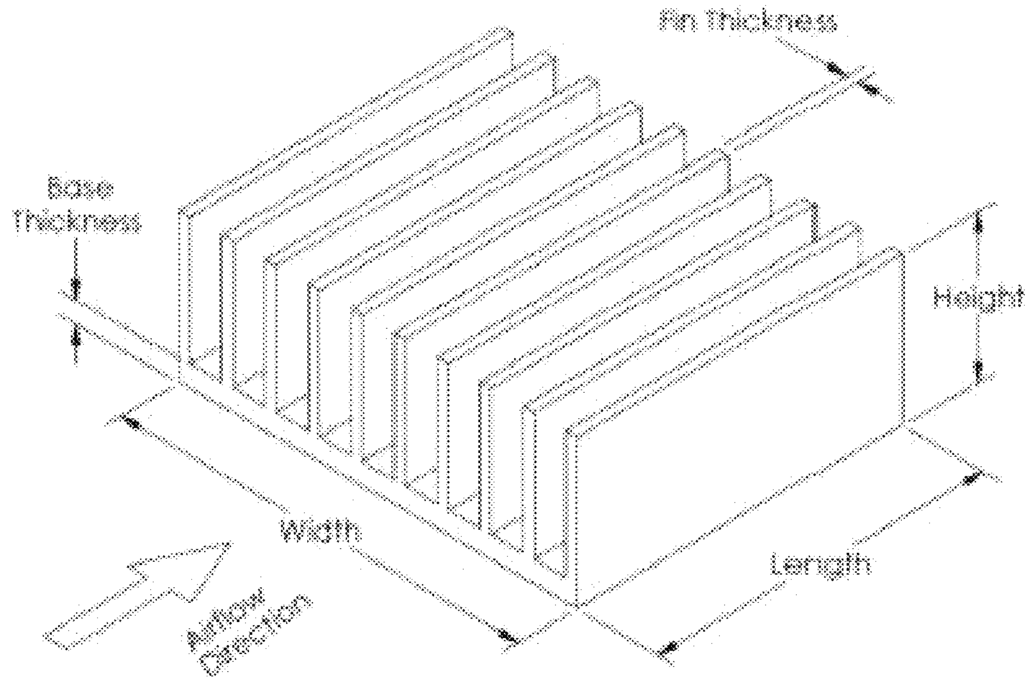
FIG. 1 is a perspective view of an exemplary heat sink designed for air cooling, in accordance with the prior art.

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications described herein, as these may vary. It is also to be understood that the terminology used herein is used for the purpose of describing particular embodiments only and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

All words of approximation as used in the present disclosure and claims should be construed to mean "approximate," rather than "perfect," and may accordingly be employed as a meaningful modifier to any other word, specified parameter, quantity, quality, or concept. Words of approximation, include, yet are not limited to terms such as "substantial", "nearly", "almost", "about", "generally", "largely", "essentially", "closely approximate", etc.

As will be established in some detail below, it is well settled law, as early as 1939, that words of approximation are not indefinite in the claims even when such limits are not defined or specified in the specification.

For example, see Ex parte Mallory, 52 USPQ 297, 297 (Pat. Off. Bd. App. 1941) where the court said "The examiner has held that most of the claims are inaccurate because apparently the laminar film will not be entirely eliminated. The claims specify that the film is "substantially" eliminated and for the intended purpose, it is believed that the slight portion of the film which may remain is negligible. We are of the view, therefore, that the claims may be regarded as sufficiently accurate."

Note that claims need only "reasonably apprise those skilled in the art" as to their scope to satisfy the definiteness requirement. See Energy Absorption Sys., Inc. v. Roadway Safety Servs., Inc., Civ. App. 96-1264, slip op. at 10 (Fed. Cir. Jul. 3, 1997) (unpublished) Hybridtech v. Monoclonal Antibodies, Inc., 802 F.2d 1367, 1385, 231 USPQ 81, 94 (Fed. Cir. 1986), cert. denied, 480 U.S. 947 (1987). In addition, the use of modifiers in the claim, like "generally" and "substantial," does not by itself render the claims indefinite. See Seattle Box Co. v. Industrial Crating & Packing, Inc., 731 F.2d 818, 828-29, 221 USPQ 568, 575-76 (Fed. Cir. 1984).

Moreover, the ordinary and customary meaning of terms like "substantially" includes "reasonably close to: nearly, almost, about", connoting a term of approximation. See In re Frye, Appeal No. 2009-006013, 94 USPQ2d 1072, 1077, 2010 WL 889747 (B.P.A.I. 2010) Depending on its usage, the word "substantially" can denote either language of approximation or language of magnitude. Deering Precision Instruments, L.L.C. v. Vector Distribution Sys., Inc., 347 F.3d 1314, 1323 (Fed. Cir. 2003) (recognizing the "dual ordinary meaning of th[e] term ["substantially"] as connoting a term of approximation or a term of magnitude"). Here, when referring to the "substantially halfway" limitation, the Specification uses the word "approximately" as a substitute for the word "substantially" (Fact 4). (Fact 4). The ordinary meaning of "substantially halfway" is thus reasonably close to or nearly at the midpoint between the forwardmost point of the upper or outsole and the rearwardmost point of the upper or outsole.

Similarly, the term 'substantially' is well recognized in case law to have the dual ordinary meaning of connoting a term of approximation or a term of magnitude. See Dana Corp. v. American Axle & Manufacturing, Inc., Civ. App. 04-1116, 2004 U.S. App. LEXIS 18265, *13-14 (Fed. Cir. Aug. 27, 2004) (unpublished). The term "substantially" is commonly used by claim drafters to indicate approximation. See Cordis Corp. v. Medtronic AVE Inc., 339 F.3d 1352, 1360 (Fed. Cir. 2003) ("The patents do not set out any numerical standard by which to determine whether the thickness of the wall surface is 'substantially uniform.' The term 'substantially,' as used in this context, denotes approximation. Thus, the walls must be of largely or approximately uniform thickness."); see also Deering Precision Instruments, LLC v. Vector Distribution Sys., Inc., 347 F.3d 1314, 1322 (Fed. Cir. 2003); Epcon Gas Sys., Inc. v. Bauer Compressors, Inc., 279 F.3d 1022, 1031 (Fed. Cir. 2002). We find that the term "substantially" was used in just such a manner in the claims of the patents-in-suit: "substantially uniform wall thickness" denotes a wall thickness with approximate uniformity.

It should also be noted that such words of approximation as contemplated in the foregoing clearly limits the scope of claims such as saying 'generally parallel' such that the adverb 'generally' does not broaden the meaning of parallel. Accordingly, it is well settled that such words of approximation as contemplated in the foregoing (e.g., like the phrase 'generally parallel') envisions some amount of deviation from perfection (e.g., not exactly parallel), and that such words of approximation as contemplated in the foregoing are descriptive terms commonly used in patent claims to avoid a strict numerical boundary to the specified parameter. To the extent that the plain language of the claims relying on such words of approximation as contemplated in the foregoing are clear and uncontradicted by anything in the written description herein or the figures thereof, it is improper to rely upon the present written description, the figures, or the prosecution history to add limitations to any of the claim of the present invention with respect to such words of approximation as contemplated in the foregoing. That is, under such circumstances, relying on the written description and prosecution history to reject the ordinary and customary meanings of the words themselves is impermissible. See, for example, Liquid Dynamics Corp. v. Vaughan Co., 355 F.3d 1361, 69 USPQ2d 1595, 1600-01 (Fed. Cir. 2004). The plain language of phrase 2 requires a "substantial helical flow." The term "substantial" is a meaningful modifier implying "approximate," rather than "perfect." In Cordis Corp. v. Medtronic AVE, Inc., 339 F.3d 1352, 1361 (Fed. Cir. 2003), the district court imposed a precise numeric constraint on the term "substantially uniform thickness." We noted that the proper interpretation of this term was "of largely or approximately uniform thickness" unless something in the prosecution history imposed the "clear and unmistakable disclaimer" needed for narrowing beyond this simple-language interpretation. Id. In Anchor Wall Systems v. Rockwood Retaining Walls, Inc., 340 F.3d 1298, 1311 (Fed. Cir. 2003)" Id. at 1311 Similarly, the plain language of claim 1 requires neither a perfectly helical flow nor a flow that returns precisely to the center after one rotation (a limitation that arises only as a logical consequence of requiring a perfectly helical flow).

The reader should appreciate that case law generally recognizes a dual ordinary meaning of such words of approximation, as contemplated in the foregoing, as connoting a term of approximation or a term of magnitude; e.g., see Deering Precision Instruments, L.L.C. v. Vector Distrib. Sys., Inc., 347 F.3d 1314, 68 USPQ2d 1716, 1721 (Fed. Cir. 2003), cert. denied, 124 S. Ct. 1426 (2004) where the court was asked to construe the meaning of the term "substantially" in a patent claim. Also see Epcon, 279 F.3d at 1031 ("The phrase 'substantially constant' denotes language of approximation, while the phrase 'substantially below' signifies language of magnitude, i.e., not insubstantial."). Also, see, e.g., Epcon Gas Sys., Inc. v. Bauer Compressors, Inc., 279 F.3d 1022 (Fed. Cir. 2002) (construing the terms "substantially constant" and "substantially below"); Zodiac Pool Care, Inc. v. Hoffinger Indus., Inc., 206 F.3d 1408 (Fed. Cir. 2000) (construing the term "substantially inward"); York Prods., Inc. v. Cent. Tractor Farm & Family Ctr., 99 F.3d 1568 (Fed. Cir. 1996) (construing the term "substantially the entire height thereof"); Tex. Instruments Inc. v. Cypress Semiconductor Corp., 90 F.3d 1558 (Fed. Cir. 1996) (construing the term "substantially in the common plane"). In conducting their analysis, the court instructed to begin with the ordinary meaning of the claim terms to one of ordinary skill in the art. Prima Tek, 318 F.3d at 1148. Reference to dictionaries and our cases indicates that the term "substantially" has numerous ordinary meanings. As the district court stated, "substantially" can mean "significantly" or "considerably." The term "substantially" can also mean "largely" or "essentially." Webster's New 20th Century Dictionary 1817 (1983).

Words of approximation, as contemplated in the foregoing, may also be used in phrases establishing approximate ranges or limits, where the end points are inclusive and approximate, not perfect; e.g., see AK Steel Corp. v. Sollac, 344 F.3d 1234, 68 USPQ2d 1280, 1285 (Fed. Cir. 2003) where it where the court said [W]e conclude that the ordinary meaning of the phrase "up to about 10%" includes the "about 10%" endpoint. As pointed out by AK Steel, when an object of the preposition "up to" is nonnumeric, the most natural meaning is to exclude the object (e.g., painting the wall up to the door). On the other hand, as pointed out by Sollac, when the object is a numerical limit, the normal meaning is to include that upper numerical limit (e.g., counting up to ten, seating capacity for up to seven passengers). Because we have here a numerical limit—"about 10%"—the ordinary meaning is that that endpoint is included.

In the present specification and claims, a goal of employment of such words of approximation, as contemplated in the foregoing, is to avoid a strict numerical boundary to the modified specified parameter, as sanctioned by Pall Corp. v. Micron Separations, Inc., 66 F.3d 1211, 1217, 36 USPQ2d 1225, 1229 (Fed. Cir. 1995) where it states "It is well established that when the term "substantially" serves reasonably to describe the subject matter so that its scope would be understood by persons in the field of the invention, and to distinguish the claimed subject matter from the prior art, it is not indefinite." Likewise see Verve LLC v. Crane Cams Inc., 311 F.3d 1116, 65 USPQ2d 1051, 1054 (Fed. Cir. 2002). Expressions such as "substantially" are used in patent documents when warranted by the nature of the invention, in order to accommodate the minor variations that may be appropriate to secure the invention. Such usage may well satisfy the charge to "particularly point out and distinctly claim" the invention, 35 U.S.C. § 112, and indeed may be necessary in order to provide the inventor with the benefit of his invention. In Andrew Corp. v. Gabriel Elecs. Inc., 847 F.2d 819, 821-22, 6 USPQ2d 2010, 2013 (Fed. Cir. 1988) the court explained that usages such as "substantially equal" and "closely approximate" may serve to describe the invention with precision appropriate to the technology and without intruding on the prior art. The court again explained in Ecolab Inc. v. Envirochem, Inc., 264 F.3d 1358, 1367, 60 USPQ2d 1173, 1179 (Fed. Cir. 2001) that "like the term 'about,' the term 'substantially' is a descriptive term commonly used in patent claims to 'avoid a strict numerical boundary to the specified parameter, see Ecolab Inc. v. Envirochem Inc., 264 F.3d 1358, 60 USPQ2d 1173, 1179 (Fed. Cir. 2001) where the court found that the use of the term "substantially" to modify the term "uniform" does not render this phrase so unclear such that there is no means by which to ascertain the claim scope.

Similarly, other courts have noted that like the term "about," the term "substantially" is a descriptive term commonly used in patent claims to "avoid a strict numerical boundary to the specified parameter."; e.g., see Pall Corp. v. Micron Seps., 66 F.3d 1211, 1217, 36 USPQ2d 1225, 1229 (Fed. Cir. 1995); see, e.g., Andrew Corp. v. Gabriel Elecs. Inc., 847 F.2d 819, 821-22, 6 USPQ2d 2010, 2013 (Fed. Cir. 1988) (noting that terms such as "approach each other," "close to," "substantially equal," and "closely approximate" are ubiquitously used in patent claims and that such usages, when serving reasonably to describe the claimed subject matter to those of skill in the field of the invention, and to distinguish the claimed subject matter from the prior art, have been accepted in patent examination and upheld by the courts). In this case, "substantially" avoids the strict 100% nonuniformity boundary.

Indeed, the foregoing sanctioning of such words of approximation, as contemplated in the foregoing, has been established as early as 1939, see Ex parte Mallory, 52 USPQ 297, 297 (Pat. Off. Bd. App. 1941) where, for example, the court said "the claims specify that the film is "substantially" eliminated and for the intended purpose, it is believed that the slight portion of the film which may remain is negligible. We are of the view, therefore, that the claims may be regarded as sufficiently accurate." Similarly, In re Hutchison, 104 F.2d 829, 42 USPQ 90, 93 (C.C.P.A. 1939) the court said, "It is realized that "substantial distance" is a relative and somewhat indefinite term, or phrase, but terms and phrases of this character are not uncommon in patents in cases where, according to the art involved, the meaning can be determined with reasonable clearness."

Hence, for at least the forgoing reason, Applicants submit that it is improper for any examiner to hold as indefinite any claims of the present patent that employ any words of approximation.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will be described in detail below with reference to embodiments thereof as illustrated in the accompanying drawings.

References to a "device," an "apparatus," a "system," etc., in the preamble of a claim should be construed broadly to mean "any structure meeting the claim terms" exempt for any specific structure(s)/type(s) that has/(have) been explicitly disavowed or excluded or admitted/implied as prior art in the present specification or incapable of enabling an object/aspect/goal of the invention. Furthermore, where the present specification discloses an object, aspect, function, goal, result, or advantage of the invention that a specific prior art structure and/or method step is similarly capable of performing yet in a very different way, the present invention disclosure is intended to and shall also implicitly include and cover additional corresponding alternative embodiments that are otherwise identical to that explicitly disclosed except that they exclude such prior art structure(s)/step(s), and shall accordingly be deemed as providing sufficient disclosure to support a corresponding negative limitation in a claim claiming such alternative embodiment(s), which exclude such very different prior art structure(s)/step(s) way(s).

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," "some embodiments," "embodiments of the invention," etc., may indicate that the embodiment(s) of the invention so described may include a particular feature, structure, or characteristic, but not every possible embodiment of the invention necessarily includes the particular feature, structure, or characteristic. Further, repeated use of the phrase "in one embodiment," or "in an exemplary embodiment," "an embodiment," do not necessarily refer to the same embodiment, although they may. Moreover, any use of phrases like "embodiments" in connection with "the invention" are never meant to characterize that all embodiments of the invention must include the particular feature, structure, or characteristic, and should instead be understood to mean "at least some embodiments of the invention" include the stated particular feature, structure, or characteristic.

References to "user", or any similar term, as used herein, may mean a human or non-human user thereof. Moreover, "user", or any similar term, as used herein, unless expressly stipulated otherwise, is contemplated to mean users at any stage of the usage process, to include, without limitation, direct user(s), intermediate user(s), indirect user(s), and end user(s). The meaning of "user", or any similar term, as used herein, should not be otherwise inferred, or induced by any pattern(s) of description, embodiments, examples, or referenced prior art that may (or may not) be provided in the present patent.

References to "end user", or any similar term, as used herein, is generally intended to mean late-stage user(s) as opposed to early-stage user(s). Hence, it is contemplated that there may be a multiplicity of different types of "end user" near the end stage of the usage process. Where applicable, especially with respect to distribution channels of embodiments of the invention comprising consumed retail products/services thereof (as opposed to sellers/vendors or Original Equipment Manufacturers), examples of an "end user" may include, without limitation, a "consumer", "buyer", "customer", "purchaser", "shopper", "enjoyer", "viewer", or individual person or non-human thing benefiting in any way, directly or indirectly, from use of. or interaction, with some aspect of the present invention.

In some situations, some embodiments of the present invention may provide beneficial usage to more than one stage or type of usage in the foregoing usage process. In such cases where multiple embodiments targeting various stages of the usage process are described, references to "end user", or any similar term, as used therein, are generally intended to not include the user that is the furthest removed, in the foregoing usage process, from the final user therein of an embodiment of the present invention.

Where applicable, especially with respect to retail distribution channels of embodiments of the invention, intermediate user(s) may include, without limitation, any individual person or non-human thing benefiting in any way, directly or indirectly, from use of, or interaction with, some aspect of the present invention with respect to selling, vending, Original Equipment Manufacturing, marketing, merchandising, distributing, service providing, and the like thereof.

References to "person", "individual", "human", "a party", "animal", "creature", or any similar term, as used herein, even if the context or particular embodiment implies living user, maker, or participant, it should be understood that such characterizations are sole by way of example, and not limitation, in that it is contemplated that any such usage, making, or participation by a living entity in connection with making, using, and/or participating, in any way, with embodiments of the present invention may be substituted by such similar performed by a suitably configured non-living entity, to include, without limitation, automated machines, robots, humanoids, computational systems, information processing systems, artificially intelligent systems, and the like. It is further contemplated that those skilled in the art will readily recognize the practical situations where such living makers, users, and/or participants with embodiments of the present invention may be in whole, or in part, replaced with such non-living makers, users, and/or participants with embodiments of the present invention. Likewise, when those skilled in the art identify such practical situations where such living makers, users, and/or participants with embodiments of the present invention may be in whole, or in part, replaced with such non-living makers, it will be readily apparent in light of the teachings of the present invention how to adapt the described embodiments to be suitable for such non-living makers, users, and/or participants with embodiments of the present invention. Thus, the invention is thus to also cover all such modifications, equivalents, and alternatives falling within the spirit and scope of such adaptations and modifications, at least in part, for such non-living entities.

Headings provided herein are for convenience and are not to be taken as limiting the disclosure in any way.

The enumerated listing of items does not imply that any or all of the items are mutually exclusive, unless expressly specified otherwise.

It is understood that the use of specific component, device and/or parameter names are for example only and not meant to imply any limitations on the invention. The invention may thus be implemented with different nomenclature/terminology utilized to describe the mechanisms/units/structures/components/devices/parameters herein, without limitation. Each term utilized herein is to be given its broadest interpretation given the context in which that term is utilized.

Terminology. The following paragraphs provide definitions and/or context for terms found in this disclosure (including the appended claims):

"Comprising" And "contain" and variations of them—Such terms are open-ended and mean "including but not limited to". When employed in the appended claims, this term does not foreclose additional structure or steps. Consider a claim that recites: "A memory controller comprising a system cache . . . " Such a claim does not foreclose the memory controller from including additional components (e.g., a memory channel unit, a switch).

"Configured To." Various units, circuits, or other components may be described or claimed as "configured to" perform a task or tasks. In such contexts, "configured to" or "operable for" is used to connote structure by indicating that the mechanisms/units/circuits/components include structure (e.g., circuitry and/or mechanisms) that performs the task or tasks during operation. As such, the mechanisms/unit/circuit/component can be said to be configured to (or be operable) for perform(ing) the task even when the specified mechanisms/unit/circuit/component is not currently operational (e.g., is not on). The mechanisms/units/circuits/components used with the "configured to" or "operable for" language include hardware—for example, mechanisms, structures, electronics, circuits, memory storing program instructions executable to implement the operation, etc. Reciting that a mechanism/unit/circuit/component is "configured to" or "operable for" perform(ing) one or more tasks is expressly intended not to invoke 35 U.S.C. sctn.112, sixth paragraph, for that mechanism/unit/circuit/component. "Configured to" may also include adapting a manufacturing process to fabricate devices or components that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The terms "a", "an" and "the" mean "one or more", unless expressly specified otherwise.

All terms of exemplary language (e.g., including, without limitation, "such as", "like", "for example", "for instance", "similar to", etc.) are not exclusive of any other, potentially, unrelated, types of examples; thus, implicitly mean "by way of example, and not limitation . . . ", unless expressly specified otherwise.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phrase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" and "consisting of" limits the scope of a claim to the specified elements or method steps, plus those that do not materially affect the basis and novel characteristic(s) of the claimed subject matter (see Norian Corp. v Stryker Corp., 363 F.3d 1321, 1331-32, 70 USPQ2d 1508, Fed. Cir. 2004). Moreover, for any claim of the present invention which claims an embodiment "consisting essentially of" or "consisting of" a certain set of elements of any herein described embodiment it shall be understood as obvious by those skilled in the art that the present invention also covers all possible varying scope variants of any described embodiment(s) that are each exclusively (i.e., "consisting essentially of") functional subsets or functional combination thereof such that each of these plurality of exclusive varying scope variants each consists essentially of any functional subset(s) and/or functional combination(s) of any set of elements of any described embodiment(s) to the exclusion of any others not set forth therein. That is, it is contemplated that it will be obvious to those skilled how to create a multiplicity of alternate embodiments of the present invention that simply consisting essentially of a certain functional combination of elements of any described embodiment(s) to the exclusion of any others not set forth therein, and the invention thus covers all such exclusive embodiments as if they were each described herein.

With respect to the terms "comprising," "consisting of," and "consisting essentially of," where one of these three terms is used herein, the disclosed and claimed subject matter may include the use of either of the other two terms. Thus, in some embodiments not otherwise explicitly recited, any instance of "comprising" may be replaced by "consisting of" or, alternatively, by "consisting essentially of", and thus, for the purposes of claim support and construction for "consisting of" format claims, such replacements operate to create yet other alternative embodiments "consisting essentially of" only the elements recited in the original "comprising" embodiment to the exclusion of all other elements.

Moreover, any claim limitation phrased in functional limitation terms covered by 35 USC § 112(6) (post AIA 112(f)) which has a preamble invoking the closed terms "consisting of," or "consisting essentially of," should be understood to mean that the corresponding structure(s) disclosed herein define the exact metes and bounds of what the so claimed invention embodiment(s) consists of, or consisting essentially of, to the exclusion of any other elements which do not materially affect the intended purpose of the so claimed embodiment(s). Furthermore, any statement(s), identification(s), or reference(s) to a structure(s) and/or element(s) that corresponds to and/or supports a claim limitation(s) phrased in functional limitation terms covered by 35 USC § 112(6) (post AIA 112(f)) should be understood to be identified by way of example and not limitation, and as such, should not be interpreted to mean that such recited structure and/or element is/are the only structure(s) and/or element(s) disclosed in this patent application that corresponds to and/or supports such claim limitations phrased in functional limitation terms. This claims interpretation intention also applies to any such subsequent statements made by Applicant during prosecution.

Devices or system modules that are in at least general communication with each other need not be in continuous communication with each other, unless expressly specified otherwise. In addition, devices or system modules that are in at least general communication with each other may communicate directly or indirectly through one or more intermediaries. Moreover, it is understood that any system components described or named in any embodiment or claimed herein may be grouped or sub-grouped (and accordingly implicitly renamed) in any combination or sub-combination as those skilled in the art can imagine as suitable for the particular application, and still be within the scope and spirit of the claimed embodiments of the present invention. For an example of what this means, if the invention was a controller of a motor and a valve and the embodiments and claims articulated those components as being separately grouped and connected, applying the foregoing would mean that such an invention and claims would also implicitly cover the valve being grouped inside the motor and the controller being a remote controller with no direct physical connection to the motor or internalized valve, as such the claimed invention is contemplated to cover all ways of grouping and/or adding of intermediate components or systems that still substantially achieve the intended result of the invention.

A description of an embodiment with several components in communication with each other does not imply that all such components are required. On the contrary a variety of optional components are described to illustrate the wide variety of possible embodiments of the present invention.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

It is to be understood that any exact measurements/dimensions or particular construction materials indicated herein are solely provided as examples of suitable configurations and are not intended to be limiting in any way. Depending on the needs of the particular application, those skilled in the art will readily recognize, in light of the following teachings, a multiplicity of suitable alternative implementation details.

Some embodiments of the present invention disclose cooling systems for electronic devices that incorporate the spraying of liquid coolant along the longitudinal direction of heat sink fins. Other embodiments of the present invention disclose systems for reusing the heat from a data center. Embodiments related to spray cooling systems are described first in the following description. One such embodiment may provide a thermal management solution to a certain type of high heat density electrical devices such as cyber currency miners. It is contemplated that some embodiments may be configured to provide thermal management to other types of high heat density devices and systems such as, but not limited to, computer servers, GPUs, high-density data centers, cryptocurrency miners, cryptocurrency mining racks and farms, insulated-gate bipolar transistors (IGBT) and relevant inverters, switchers, optical devices like laser and LED generators, other types of laser systems, etc. Devices and systems that may especially benefit from the thermal management provided by embodiments of the present invention may have common characteristics such as, but not limited to, multi-layer motherboards in chassis, a large number of chips/heat sources on each motherboard, limited distance between motherboards, motherboards that are mounted vertically (i.e., perpendicular to the horizon), coolant (e.g., air) flowing through the gaps between motherboards, limited blockage from other components like the hard drive box, frame and other boards, strict requirements of device cleanness and reliability, free cooling available only, heat recovery from data center, etc. The components and their layout on each motherboard are the same or different. The heat load of components and processors on each motherboard are the same or different. The geometrical profiles of the components or attached motherboards are the same or different. It is contemplated that embodiments of the present invention may be implemented to cool different computer server models with different heat loads in one enclosure by adjusting the spray pattern (position of spray holes and size of spray holes). This feature can be helpful to realize the modular/standard design of these cooling systems where the sprayers can be made as customized components are. Compared with conventional approaches where all objectives are physically immerged in a big tank, the objectives to be cooled by embodiments of the present invention can be different because the coolant is supplied by amount and position as it is needed, and the cooling of different objectives are not affected by each other.

Figure 2A:
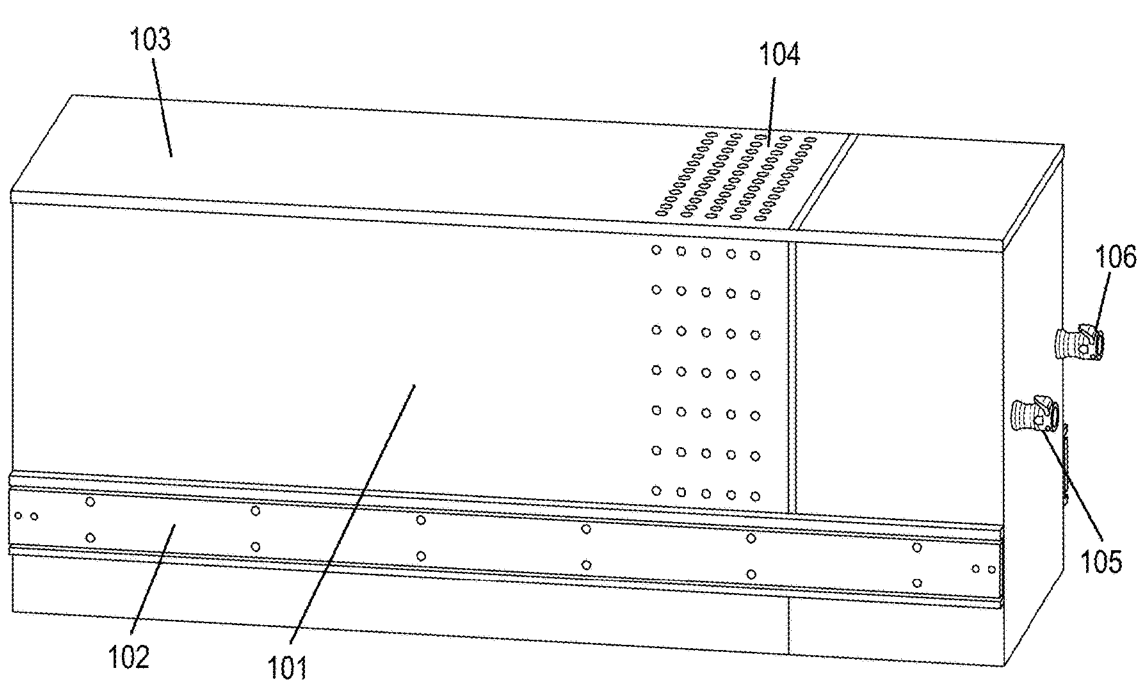
FIGS. 2A through 2F illustrate an exemplary thermal management system comprising a liquid cooling cell configured to cool cryptocurrency miners, in accordance with the embodiment of the present invention.
Figure 2B:
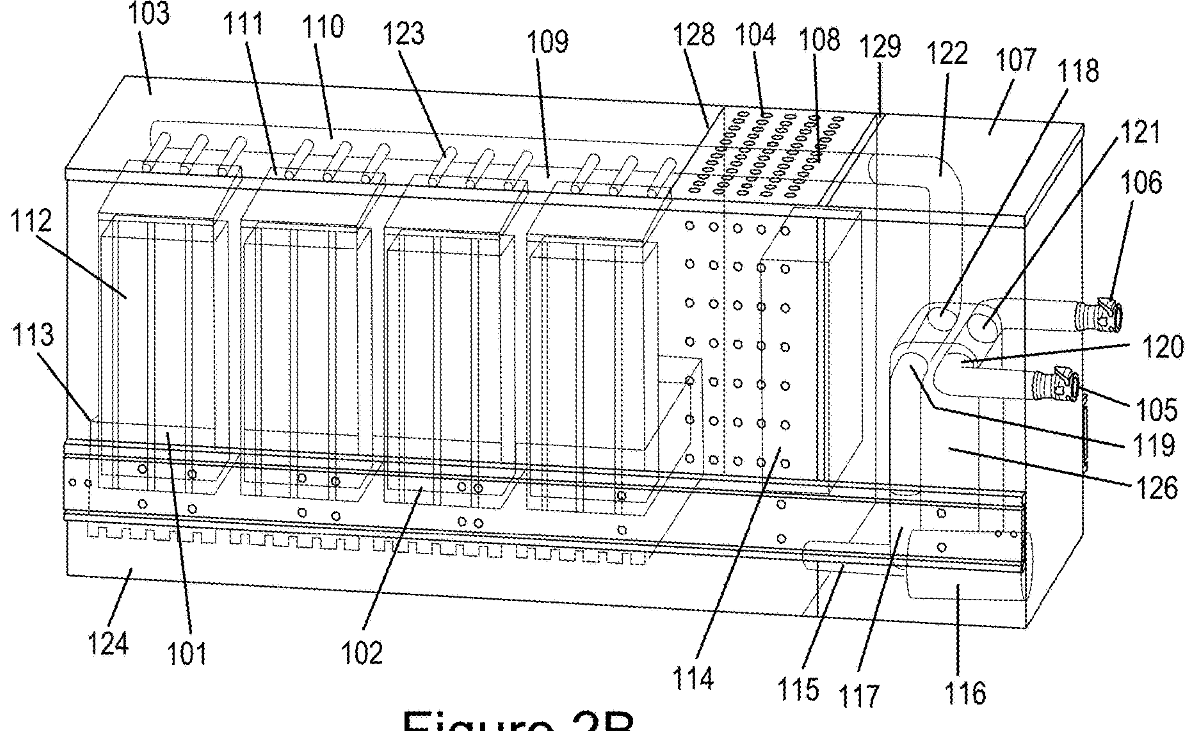
Figure 2C:
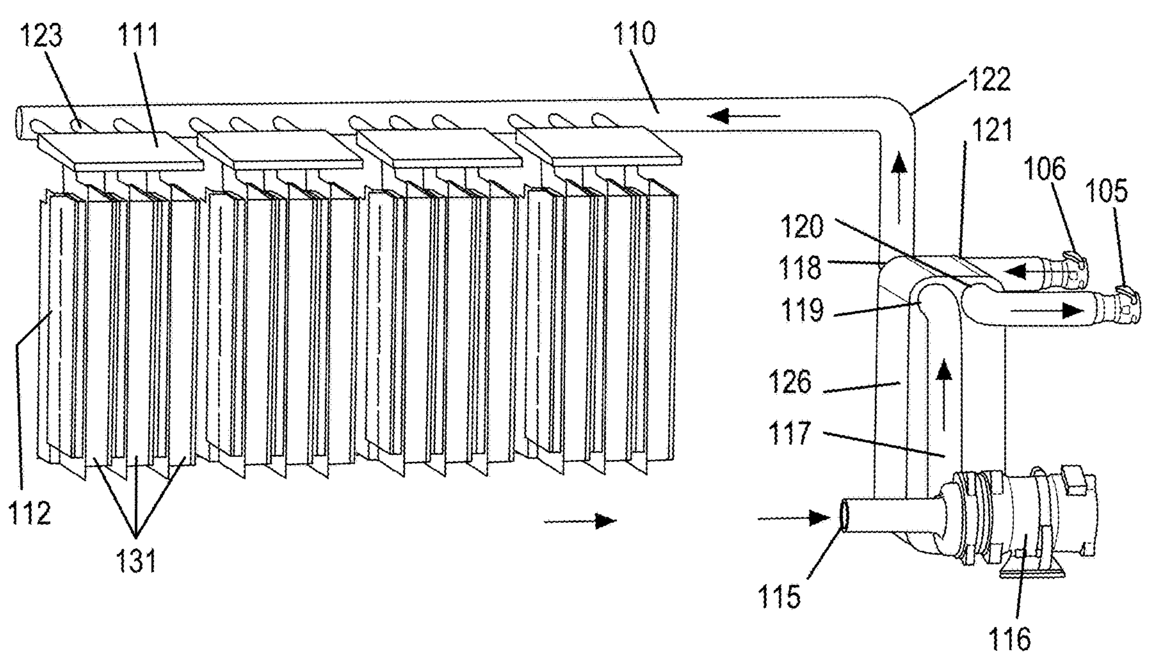
Figure 2D:
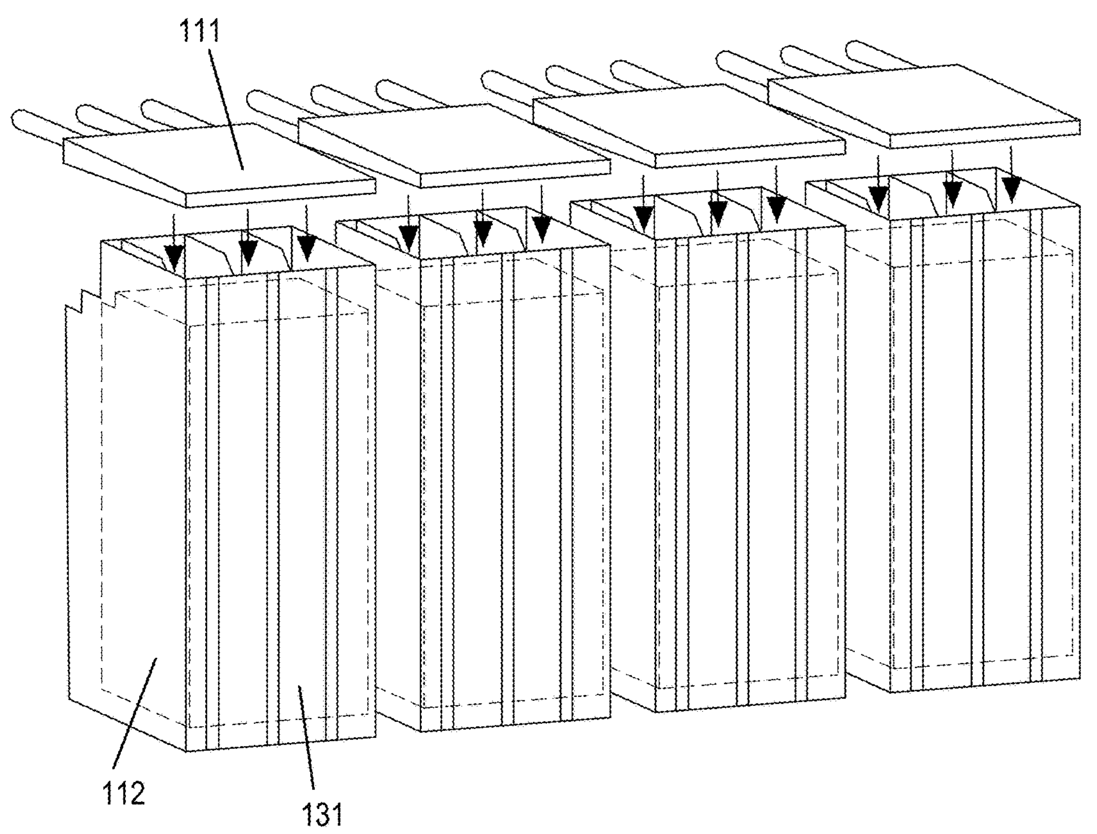
Figure 2E:
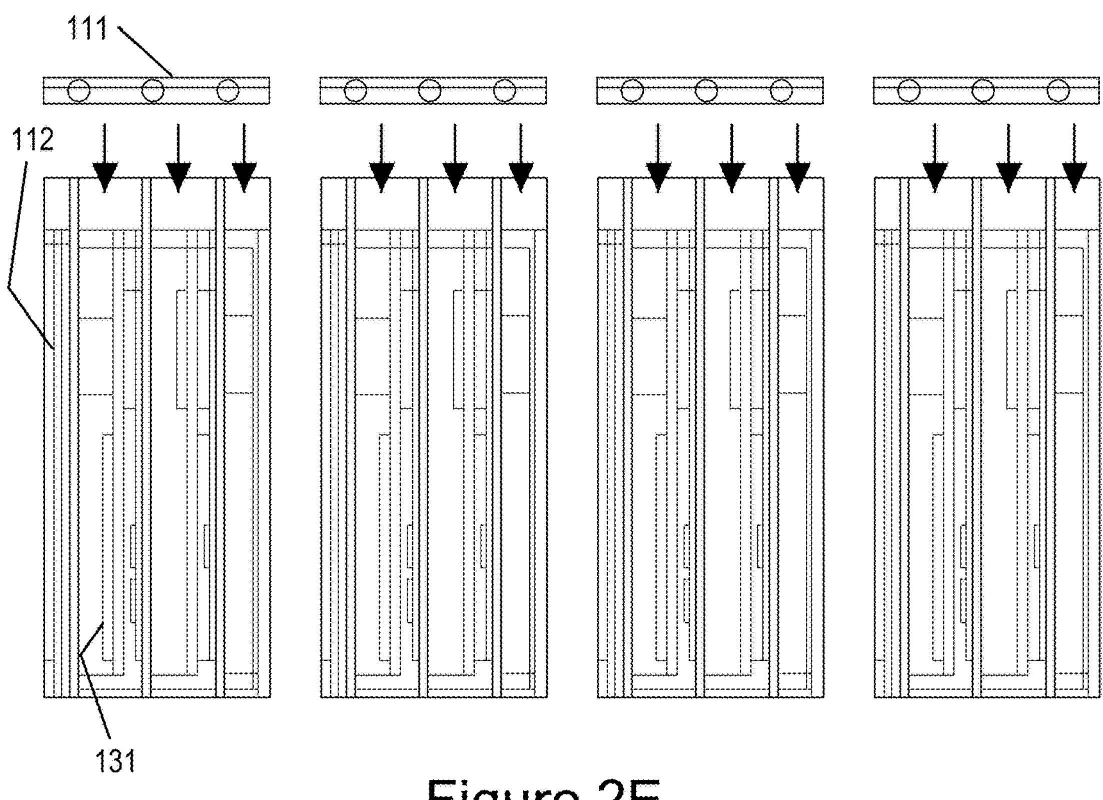
Figure 2F:
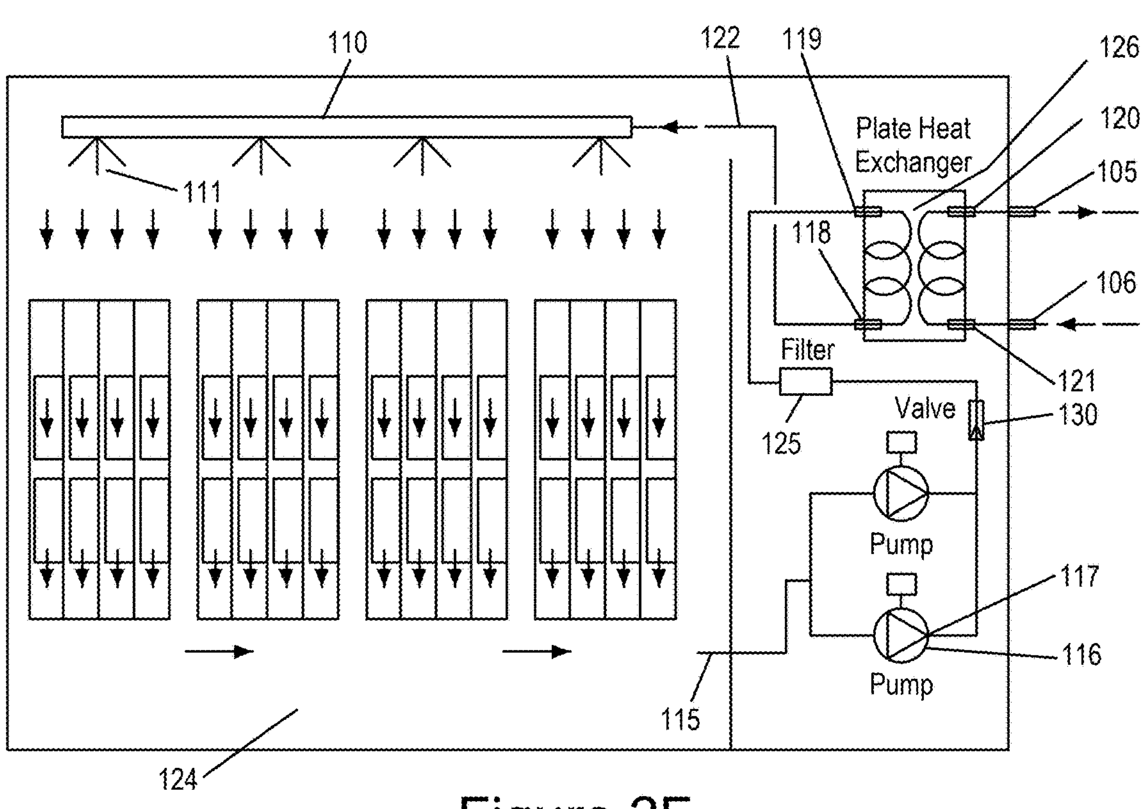

FIGS. 2A through 2F illustrate an exemplary thermal management system comprising a liquid cooling cell configured to cool cryptocurrency miners 112, in accordance with the embodiment of the present invention. FIG. 2A is a side perspective view of the liquid cooling cell. FIG. 2B is a partially transparent view of the liquid cooling cell. FIG. 2C is a side perspective view of a coolant circulation system within the liquid cooling cell. FIG. 2D is a side perspective view of a spray cooling mechanism. FIG. 2E is a front view of the spray cooling mechanism, and FIG. 2F is a schematic diagram of the thermal management system. In the present embodiment a housing 101 and a cover 103 form a chamber separated into three sections, a heat exchanger/pump section 107, an electrical power section 108 and a spray cooling section 109. Each section is isolated from the other sections. It is contemplated that in alternate embodiments the chamber may comprise more or fewer sections. For example, without limitation, the embodiment illustrated in FIGS. 8A-8C discloses a chamber separated into two sections, a heat exchanger section, and a cooling section. In the present embodiment, housing 101, cover 103, and dividers 128 and 129 that separate the chamber into the separate sections, may be made of various materials such as, but not limited to stainless steel, carbon steel sheet metal, other types of sheet metal, plastics that are suitable for use with dielectric oil, resin, fiber glass, etc. Sliding rails 102 may be disposed on the outer surface of housing 101. A pair of sliding rails 102 can provide the possibility to install housing 101 onto a frame so that housing 101 can be slid in and out of the frame. This allows for multiple housings 101 to be stacked in the frame vertically, to achieve much higher space utilization efficiency. Meanwhile, housing 101 can be pulled out of the frame easily with the help of a pair of sliding rails 102. In the present embodiment a coolant supply header 110, sprayers 111, miners 112, a supporting frame 113, a pump suction port 115, spray coolant sub supply lines 123, and a reservoir 124 are included in spray cooling section 109. In typical use of the liquid cooling cell, coolant liquid from coolant supply header 110 flows into spray coolant sub supply lines 123, then to sprayers 111, and then may be pushed through spray holes 127. The cold coolant liquid from the spray holes 127 may be sprayed onto and into the miners 112 below in a specified pattern to carry heat away from miners 112. The heated coolant liquid may flow down the miners 112 and other components within the spray cooling section to be collected in a reservoir 124 under the miners 112.

The spray cooling section 109 may hold more than one miner 112, relevant sprayer 111 and other components including, but not limited to, supporting frame 113 and spray coolant sub supply lines 123. The quantity of miners 112 that may be contained in the spray cooling section 109 typically depends on the total heat capacity of miners 112. The number of miners may depend on dimensions, heat load, geometrical profile and permitted space for the design. It is a tradeoff of various design factors, particularly between cost and reliability. For example, the cost of a bigger housing per miner would generally be lower than that of a smaller housing per miner. However, one may expect that the bigger housing containing more miners would generally have lower reliability than that of a smaller housing. Another potential disadvantage of a larger housing may be that the larger weight may make it difficult to find a suitable heavy-duty slide rail at a reasonable cost. Thus, a system designer may take these factors into consideration on a particular application to design a suitable system with an appropriate number of miners for the system's specific parameters. In the present embodiment, multiple miners 112 and relevant components share the common reservoir 124, which may collect the heated coolant liquid dripped out of miners 112. The reservoir 124 may be connected to the pump suction port 115 which connects to a circulation pump 116 that may act to pump the heated coolant liquid from the reservoir 124 and into a heat exchanger 126 to re-cool the liquid before being recirculated to the sprayers 601. The volume of reservoir 124 may be designed to be as small as possible based on factors such as, without limitation, the pumping capacity of a circulation pump 116, the amount of liquid coolant in the system, the overall size of the cooling cell, etc.

The chamber formed by the spray cooling section 109 and cover 103 may preferably be airtight to help prevent the loss of coolant liquid by liquid evaporation or droplet drift. The sprayers 111 may be located above miners 112 to typically allow for the coolant liquid to be sprayed downward at a straight angle. The coolant liquid coming from sprayers 111 approaches fins 131 of heat sinks, which are in contact with miners 112 and vertically positioned, at a certain speed, wets the surface of fins 131, flushes the surfaces of fins 131 from top to bottom longitudinally, and drips down into the reservoir 124. During this flow process, spray momentum and gravity work together to increase the forced convective heat transfer coefficient when compared to the natural convective heat transfer coefficient in a liquid immersive tub solution. The coolant supply header 110 may be connected to one or more spray coolant sub supply lines 123 for each sprayer 111. The spray coolant sub supply lines 123 could be made using flexible tubes, which may enable the sprayers 111 to be pushed upward or to the side to allow access to the miners 112, for example, without limitation to remove the miners 112 for service purposes. In alternate embodiments the spray coolant sub supply lines may be made of a more rigid material. In the present embodiment, the miners 112 may be seated on the supporting frame 113, and the supporting frame 113 may comprise holes to allow the coolant liquid to pass through and into the reservoir 124. The coolant liquid could be virtually any type of single-phase dielectric fluids such as, but not limited to, mineral oil, natural/synthetic ester oil, silicone oil, or Fluorinert fluids.

The electrical power section 108 may be formed by divider 128, divider 129, housing 101 and cover 103. The electrical power section 108 is beside the spray cooling section 109. In typical use of the present embodiment, the original miner power source modules 114 may be removed from the miners 112 to be put in the electrical power section 108. The cooling medium in the electrical power section 108 is air, which may be driven by fans in the power source modules 114 through ventilation holes 104. It is believed that the system may benefit from separating the original power source 114 from the miners 112 because of discrepancy between the maximum working temperature of the power sources 114 (i.e., max. 40 degree C. as a typical application) and mining chips in miners 112 (i.e., max. 80 degree C. as a typical application). The maximum coolant temperature is typically restricted by the smaller value of working temperature for the power sources and miner chips, which is 40 degree C. in a typical application of a power source. In addition, heat generation power from miner chips typically consumes around 90% of the total input power and the power source typically consumes 10% of the total input power in normal applications. Therefore, higher heat recovery temperature and more recovery power may be achieved by cooling the power sources and miner chips separately. Besides the higher potential of heat recovery, the present embodiment may provide the flexibility of a special application in Cryptocurrency mining, overclocking, where the miners are run at higher clock speeds than originally intended. An extra power source is normally required to overclock the chips because chips running at higher frequencies generally consume more electrical power. The electrical power section 108 could provide extra space for this purpose in some embodiments. The volume of electrical power section 108 typically depends on the size of power sources.

In the present embodiment, the heat exchanger/pump section 107 is located beside the electrical power section 108, which may be formed by divider 129, housing 101 and cover 103. The internal volume of the heat exchanger/pump section 107 may hold pump suction port 115, circulation pump 116, a pump discharging port 117, a spraying coolant heat exchanger outlet 118, a spraying coolant heat exchanger inlet 119, a coolant heat exchanger outlet 120, a coolant heat exchanger inlet 121, a spraying coolant supply line 122, a filter 125, and heat exchanger 126. The circulation pump 116 could be virtually any type of pump that is suitable to meet the required flow and header requirements for the system such as, but not limited to, a centrifugal pump or a positive displacement pump. The type of pump used may depend on factors such as the hydraulic characteristics of the circulation system, reliability requirements, cost, space, installation, services, etc. A positive displacement (PD) pump moves a fluid by repeatedly enclosing a fixed volume of fluid and moving the fluid mechanically through the system. The pumping action is cyclic and can be driven by pistons, screws, gears, rollers, diaphragms, vanes, etc. Centrifugal pumps are used to transport fluids by the conversion of rotational kinetic energy to the hydrodynamic energy of the fluid flow. The heated coolant liquid from reservoir 124 may be suctioned into the pump suction port 115, which is located under the electrical power section 108, and connected with spray cooling section 109. Circulation pump 116 may be mounted at the bottom of housing 101 to pump the coolant liquid out through pump discharging port 117. The coolant liquid exiting the pump discharging port 117 is pumped into the spraying coolant heat exchanger inlet 119 as a first fluid in the heat exchanger 126 and is cooled by a second fluid in the heat exchanger 126. The now chilled coolant liquid exits the heat exchanger 126 via spraying coolant heat exchanger outlet 118 and is pumped into the spraying coolant supply line 122, which is connected with coolant supply header 110. The cold coolant liquid from coolant supply header 110 may then be distributed into the spray coolant sub supply lines 123 and may then be sprayed through sprayer 111. The second fluid flows into heat exchanger 126 through coolant heat exchanger inlet 121 and flows out through coolant heat exchanger outlet 120. The second fluid can be supplied externally through a dripless connector outlet 105 and a dripless connector inlet 106. A check valve 130 may be used to generally prevent the liquid coolant from flowing backwards. A filter 125 may also be included in one or more locations in the pumping system is a filter. Those skilled in the art, in light of the teachings of the present invention, will readily recognize that components like check valves and filters are common in pumping systems, and that various different configurations of such components could be implemented in various embodiments including, without limitations embodiments without check valves and/or filters.

Referring to the present embodiment, a difference between liquid spray cooling in this embodiment and conventional liquid spray cooling solutions is the direction of liquid drainage. In this embodiment, the liquid generally flows downward and is drained by gravity and spraying momentum due to the vertical position of the heat sinks. In conventional solutions the liquid is typically drained by free flow due to the horizontal position of heat sinks. In practical application of the present embodiment, it is believed that spraying along the longitudinal direction of the fins of the heat sinks may provide higher momentum of the liquid approaching the heat sinks and no obstacle to drain the liquid attached on the heat sink. From a theory of thermal dynamics, the spraying momentum together with gravity can bring higher heat transferring efficiency by forming a thinner boundary layer. While a theory of liquid drainage on heat transfer is that if liquid remains on the heat exchanging surfaces such as, but not limited to heat generating GPUs and CPUs, heat sinks, and heat sink fins, the conductivity through the fluid film created by the liquid is the dominant thermal control mechanism over convection. As a result, the heat transfer away from the heat generating surfaces will likely deteriorate. Therefore, a factor impacting the heat transferring efficiency is the effectiveness of the liquid drainage from the heat exchanging surfaces. This effect may become more pronounced with conventional multi-nozzle spray cooling systems that may produce liquid accumulation or flooding, which can result in a thick and uneven liquid film on the heat exchanging surfaces. Such accumulation not only reduces coolant usage efficiency but also compromises both surface temperature uniformity and cooling performance. In extreme cases, heat transfer, especially in the central region of the heat exchanging surfaces, may shift from spray cooling to highly ineffective pool boiling. In order to help prevent liquid accumulation, various embodiments of the present invention are configured so that the liquid coolant can be sprayed longitudinally (i.e., along the length of the fins of the heat sink). It is contemplated that the longitudinal spray may result in a higher heat transferring coefficient because of quick/clear liquid drainage and a thinner liquid film on the heat sink. A smaller liquid charge amount may also be a result because of the mitigation of liquid collecting between boards/components.

Many embodiments of the present invention can utilize the existing heat sinks on heat the components to be cooled without modification, so there is generally no need to develop new heat sinks specifically for liquid cooling when using these systems. Embodiments may be used in miner/computer server cooling and good heat recovery simultaneously. It is contemplated that this concept could cool virtually any electronic devices with or without heat recovery, including, but not limited to, processors and power electronics devices. Examples of such processors may be one or more CPU, GPU, and tensor processing unit (TPU). Power electronics devices may be one or more semiconductor devices that may include, without limitation, insulated-gate bipolar transistors (IGBT), reverse conducting insulated gate bipolar transistors (RC-IGBT), metal-oxide-semiconductor field-effect transistors (MOSFET), power MOSFETs, diodes, transistors, and/or combinations thereof (e.g., power cards). As an example, the development of AI technologies drives high-performance processors to higher integration and speed and meanwhile, servers involve more processors for each unit to get better calculation capability.

Figure 3A:
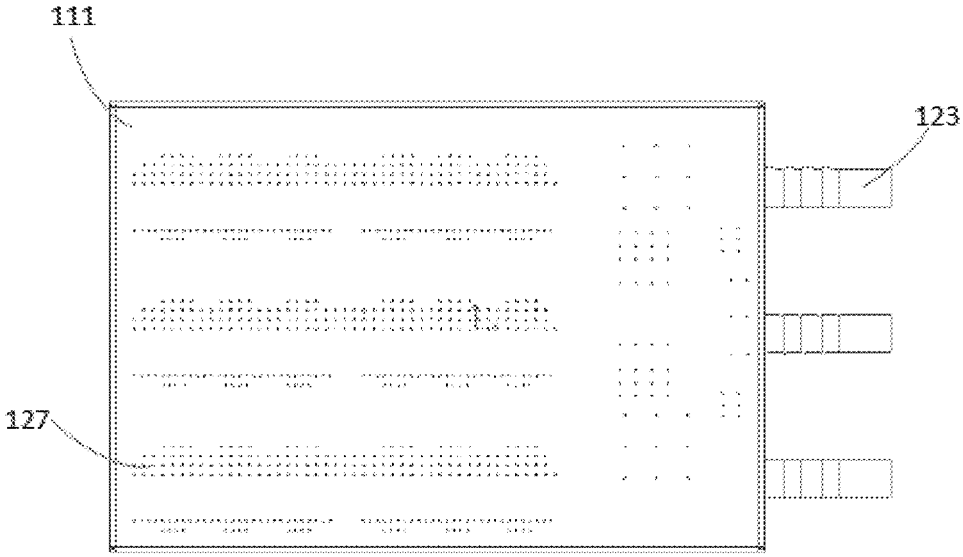
FIGS. 3A and 3B illustrate an exemplary sprayer from a thermal management system, in accordance with an embodiment of the present invention.
Figure 3B:
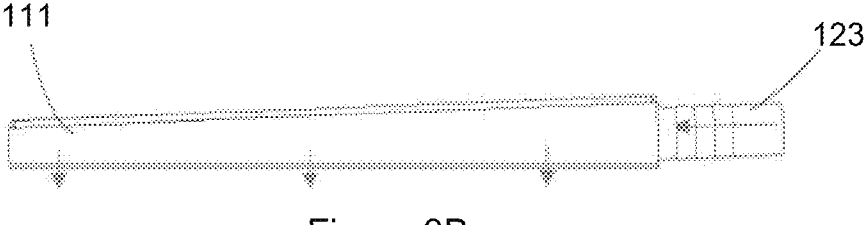

FIGS. 3A and 3B illustrate and exemplary sprayer 111 from a thermal management system, in accordance with an embodiment of the present invention. FIG. 3A is a bottom view, and FIG. 3B is a side view. This type of sprayer 111 may be used for example in the thermal management system illustrated in FIGS. 2A-2F. In the present embodiment, spray holes 127 may be patterned to match the correct mass flow distribution of a particular heat flow distribution on a heat sink. Meaning, flow of liquid is distributed to generally provide more fluid to the areas of the heat sink in higher demand for cooling (i.e., higher surface temperature). The heat sinks underneath sprayer 111 are cooled by the liquid drops exiting holes 127 in sprayer 111. The relative spatial position of holes 127 and the heat sink may determine the position of liquid being sprayed on the surface of the heat sink. Meanwhile, the density of holes 127 and the size of holes 127 determine how much liquid is being sprayed onto the heat sinks underneath. Therefore, design factors when determining the configuration of the holes in a sprayer may include, without limitation, adjusting the size of the holes and the density distribution of the holes to generally ensure enough liquid is being sprayed and adjusting the positions of holes to generally ensure the liquid is being sprayed in the correct position. The holes in the sprayer should be within the projection profile of the heat sink onto the sprayer, by which no hole should be located outside the projection profile to generally prevent any liquid flow from passing between heat sinks. Adjusting the pattern of holes in the sprayer based on the heat load distribution of the heat sink can provide the flexibility to be adaptive to different heat loads created by different working loads, by different models of chips, etc. In practice, the determination of the pattern of holes may also be based on machining skills and cost (i.e., manufacturability). In the present embodiment, the coolant liquid exits the bottom of sprayer 111 through spray holes 127 at a certain speed to properly wet the surface of heat sink fins on a miner or server. The spraying speed may be determined by a complex equilibrium between hole design, pump selection and cooling capacity, which can be obtained by experimental observation of hash board temperature under variable flow volume. There is no certain formula available for the predictive calculation. Examples of observations that may be made when determining the spraying speed may include, without limitation, the following. If the speed of the liquid exiting the holes is too low, the liquid stream out of the holes may join together due to the surface tension and liquid viscosity, and it would be likely that the joined beam will not point to the heat sink as designed. If the speed of the liquid exiting the holes is too high, extra pressure drop can happen. In addition, high-speed liquid impinged onto the heat sink can create a mist of coolant, which may result in an increase the consumption of the coolant.

In practical application of various embodiments of the present invention, decisions may be made to focus on the match between heat sinks and nozzles/sprayers. Details that may be considered include, without limitation, the liquid spraying density, the size of liquid column, the spraying speed, pump selection, spraying parameters tolerant to installation position clearance, reliability, stability, etc. Some embodiments may employ different types of sprayers with different hole sizes, densities, and patterns to distribute the liquid based on the heat load. For example, the total heat load and heat flow density of memory cards are much lower than those of CPU, so, by adjusting the position and density of holes in a sprayer similar to sprayer 111 shown by way of example in FIGS. 3A and 3B, a spraying pattern arranged specifically for the memory cards may be produced. Other embodiments may utilize nozzles rather than sprayers to distribute the liquid coolant. Nozzles may need higher liquid head pressure and larger installation space than sprayers, however, types of spray patterns that can be achieved with nozzles may make nozzles a good alternative solution for some specific applications.

Figure 4A:
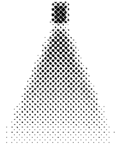
FIGS. 4A through 4F illustrate different spray patterns from nozzles that may be used in accordance with embodiments of the present invention.
Figure 4B:
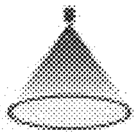
Figure 4C:
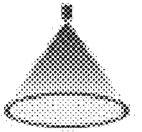
Figure 4D:
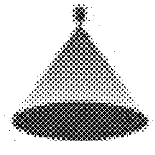
Figure 4E:
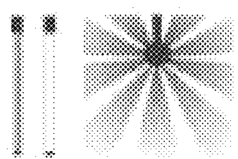
Figure 4F:
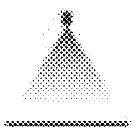

FIGS. 4A through 4F illustrate different spray patterns from nozzles that may be used in accordance with embodiments of the present invention. FIG. 4A shows a nozzle with a pneumatic atomization spray pattern, FIG. 4B shows a nozzle with an axial-flow, hollow cone spray pattern. FIG. 4C shows a nozzle with a tangential-flow hollow cone spray pattern. FIG. 4D shows a nozzle with a full cone spray pattern. FIG. 4E shows a nozzle with a solid stream/tank cleaning spray pattern, and FIG. 4F shows a nozzle with a flat fan spray patter. These various nozzle configurations may suit different types and load requirements of heat sources. Those skilled in the art will readily recognize, in light of and in accordance with the teachings of the present invention, that there are many other types of nozzles that may be used in thermal management systems according to embodiments of the present invention. The types and quantity of nozzles to be adopted in the systems may depend on the characteristics of the heat sources.

Figure 5A:
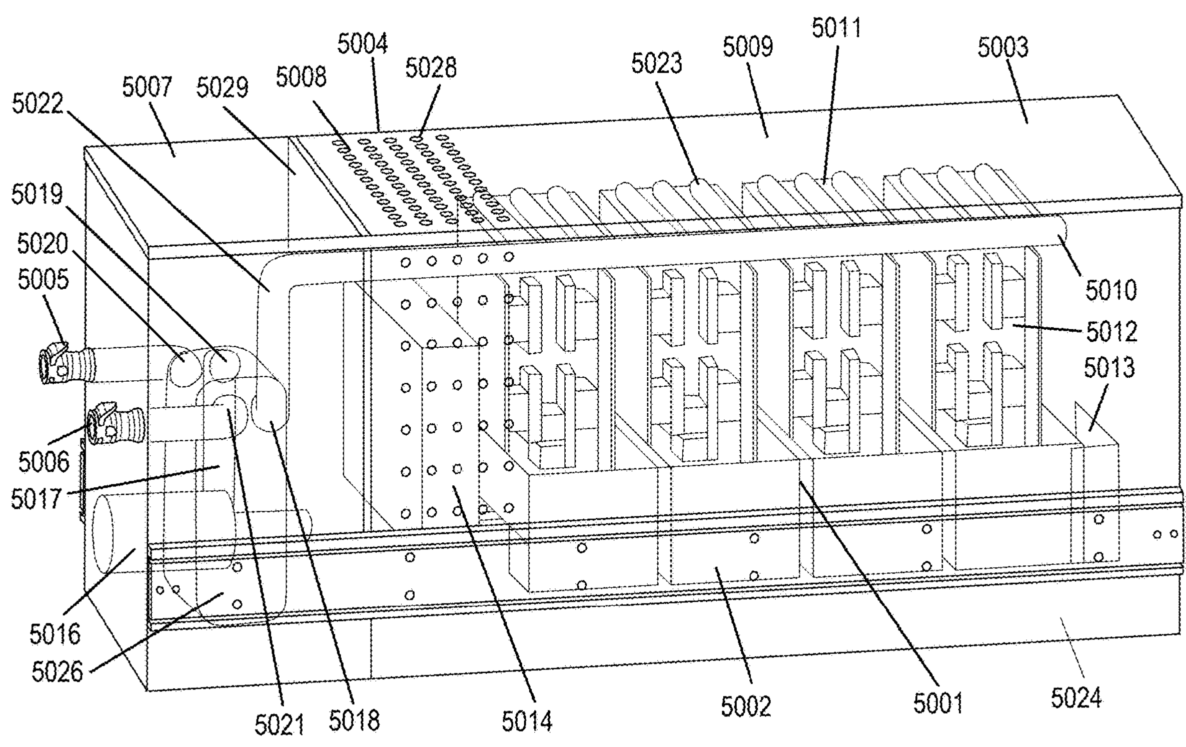
FIGS. 5A through 5C illustrate an exemplary thermal management system comprising spray nozzles to provide liquid spray cooling to cryptocurrency miners, in accordance with the embodiment of the present invention.
Figure 5B:
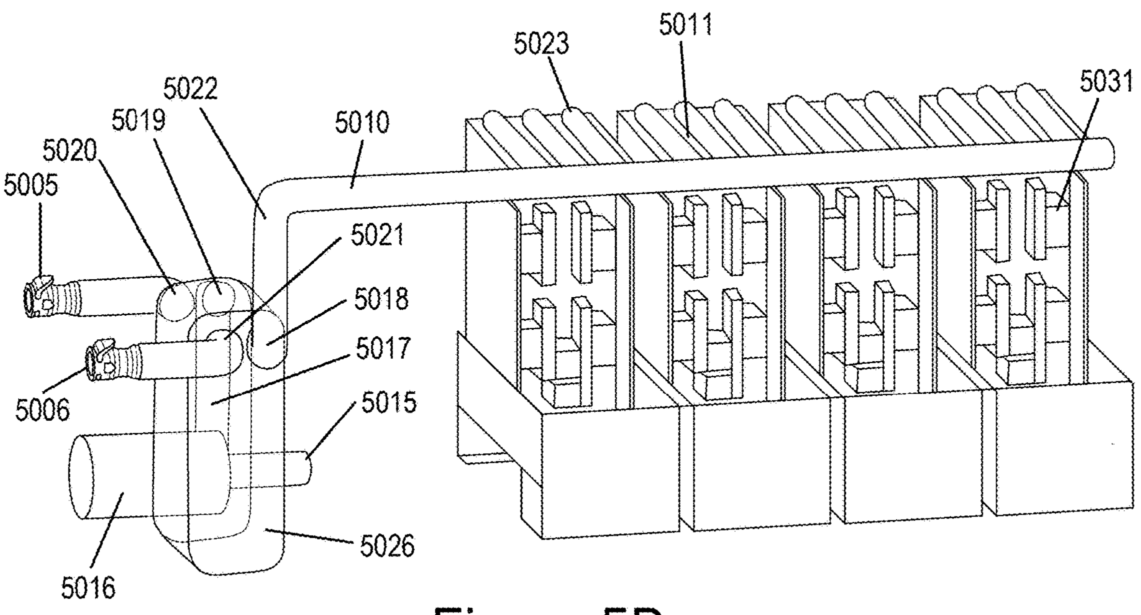
Figure 5C:
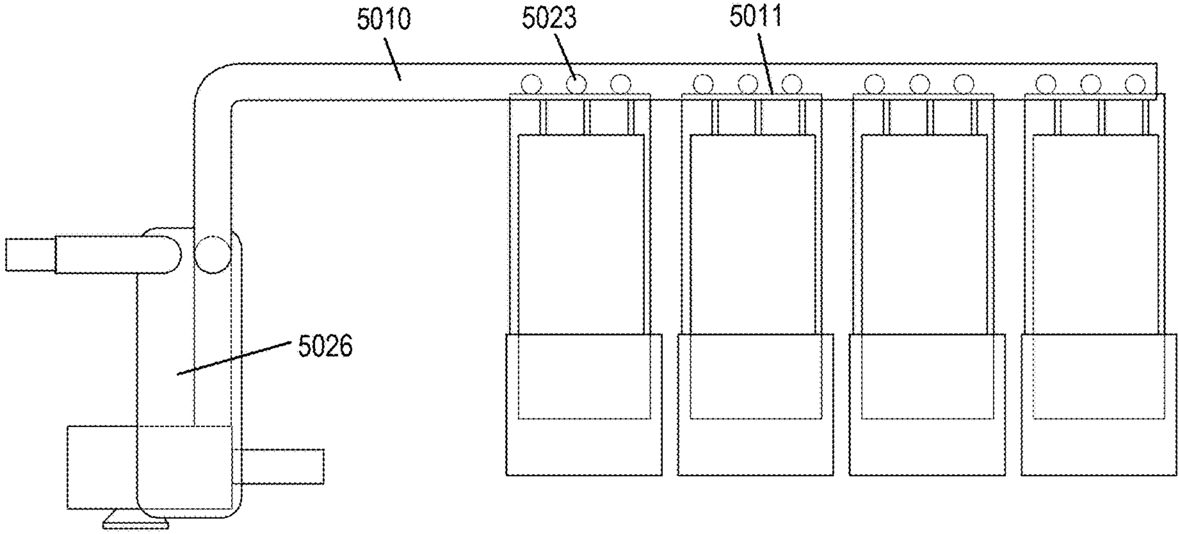

FIGS. 5A through 5C illustrate an exemplary thermal management system comprising spray nozzles 5011 to provide liquid spray cooling to cryptocurrency miners 5012, in accordance with the embodiment of the present invention. FIG. 5A is a partially transparent side perspective view of the thermal management system. FIG. 5B is a side perspective view of a coolant circulation system within the thermal management system, and FIG. 5C is a front view of the spray cooling mechanism. In the present embodiment, a housing 5001 and cover 5003 form a chamber, which could be separated by dividers 5028 and 5029 into three sections, a heat exchanger/pump section 5007, an electrical power section 5008 and a spray cooling section 5009. Each section is isolated from the other sections. Sliding rails 5002 may be disposed on the outer surface of housing 5001. A coolant supply header 5010, spray nozzles 5011, miners 5012, a supporting frame 5013, a pump suction port 5015, spray coolant sub supply lines 5023, and a reservoir 5024 may be included in spray cooling section 5009. In typical use of the present embodiment, coolant liquid from coolant supply header 5010 flows into the spray coolant sub supply lines 5023 of spray nozzles 5011, and then may be pushed through the spray nozzles 5011. The cold coolant liquid from the spray nozzles 5011 may be sprayed down into the miners 5012 underneath in a certain pattern to carry the heat from miners 5012 away. The heated coolant liquid may then be collected in reservoir 5024 under the miners 5012.

The spray cooling section 5009 can hold more than one miner 5012, relevant spray nozzle 5011 and other components including supporting frame 5013 and spray coolant sub supply line 5023. The quantity of miners 5012 may depend on the total heat capacity of miners 5012. Multiple miners 5012 and relevant components share the common reservoir 5024, which collects the heated coolant liquid that drain from miners 5012 after being sprayed onto miners 5012 in a downward direction. The reservoir 5024 may be connected to a circulation pump 5016 by a pump suction port 5015, which connects to a circulation pump 5016 that may act to pump the liquid from the reservoir 5024 and into a heat exchanger 5026 to re-cool the liquid before being recirculated to the spray nozzles 5011. The volume of reservoir 5024 is typically designed to be as small as possible mostly based on how effectively the circulation pump 5016 can suction the heated liquid safely.

The chamber formed by the spray cooling section 5009 and cover 5003 may be made to be airtight, which helps to prevent the loss of coolant liquid by liquid evaporation or droplet drift. The spray nozzles 5011 are located above the top of miners 5012 to generally ensure that coolant liquid can be sprayed straight downward. The coolant supply header 5010 may be connected to one or more spray coolant sub supply lines 5023 which are then connected to each spray nozzle 5011. The spray coolant sub supply line 5023 may be made by flexible tubes. However, some embodiments may comprise non-flexible connections for the coolant sub supply lines. The miners 5012 seat on the supporting frame 5013 and supporting frame may comprise holes to enable coolant liquid to flow through into the reservoir 5024.

The spray nozzles 5011 may be configured to match the correct mass flow distribution to the heat flow distribution on the heat sink. At first, the location of nozzles 5011 should match the positions of heat sources to generally ensure the heat sinks 5012 are accessible by the spraying liquid. Secondly, the type of nozzle (e.g., can be a cone sprayer, a chamber with holes or any type of commercial sprayer) is selected to effectively wet the heat sinks attached to the heat sources. Thirdly, the piping system should be designed to distribute the fluid to spray nozzles 5011 evenly. The coolant liquid out of spray nozzles 5011 approaches fins 5031 of the heat sinks vertically and at a certain speed to wet the surface of fins 5031, flush the surface of fins 5031 from top to bottom in a longitudinal direction, and drip into the reservoir 5024. During this flow process, spray momentum and gravity work together to increase the forced convective heat transfer coefficient when compared to the natural convective heat transfer coefficient in a liquid immersive tub solution.

The electrical power section 5008 is beside the spray cooling section 5009. In the present embodiment, the original power source modules 5014 of miners 5012 may be removed from miners 5012 and put in the electrical power section 5008. The cooling medium in the electrical power section 5008 is air, which may be driven by fans in the power source modules 5014 through ventilation holes 5004. Moving power source modules 5014 out of the spray cooling section 5009 may enable the present embodiment to take advantage of the higher maximum working temperature of the miners 5012 and may allow the liquid coolant in the spray cooling section 5009 to reach a higher temperature when absorbing heat from the miners 5012. In addition, heat generation power from miner 5012 typically take 90% of the total input power and power source modules 5014 typically take 10% of the total input power in normal application. Therefore, higher heat recovery temperature and more recovery power may be achieved by cooling the power sources and miner chips separately. Moreover, this design may also provide the flexibility to enable the miners 5012 to perform an overlocking application by providing extra space in the electrical power section 5008 for an additional power source to power this overlocking application.

The heat exchanger/pump section 5007 may be placed beside the electrical power section 5008 and may hold pump suction port 5015, circulation pump 5016, pump discharging port 5017, a spraying coolant heat exchanger outlet 5018, a spraying coolant heat exchanger inlet 5019, a coolant heat exchanger outlet 5020, a coolant heat exchanger inlet 5021, a spraying coolant supply line 5022, a filter, and heat exchanger 5026. Heated coolant liquid from reservoir 5024 may be suctioned into the pump suction port 5015, which runs under the electrical power section 5008 and to connect to the spray cooling section 5009. Circulation pump 5016 may be mounted at the bottom of housing 5001 to pump the coolant liquid out through pump discharging port 5017. The circulation pump 5016 could be virtually any type of pump that meets the flow and header parameters required by the system. The coolant liquid exiting the pump discharging port 5017 may be pumped into the spraying coolant heat exchanger inlet 5019 as the first fluid to be cooled by a second fluid in the heat exchanger 5026. The cold coolant liquid (as the first fluid) exiting spraying coolant heat exchanger outlet 5018 may then be pumped into the spraying coolant supply line 5022, which is connected to coolant supply header 5010. The cold coolant liquid exiting coolant supply header 5010 may then be distributed into the spray coolant sub supply lines 5023 and then be sprayed through sprayer nozzles 5011. The second fluid flows into heat exchanger 5026 through coolant heat exchanger inlet 5021 and flows out through coolant heat exchanger outlet 5020. The second fluid is supplied externally through a dripless connector inlet 5006 and leaves the system through a dripless connector outlet 5005. The coolant liquid used in the system could be virtually any type of single-phase dielectric fluids, such as, but not limited to, mineral oil, natural/synthetic ester oil, silicone oil, Fluorinert fluids, etc.

Figure 6A:
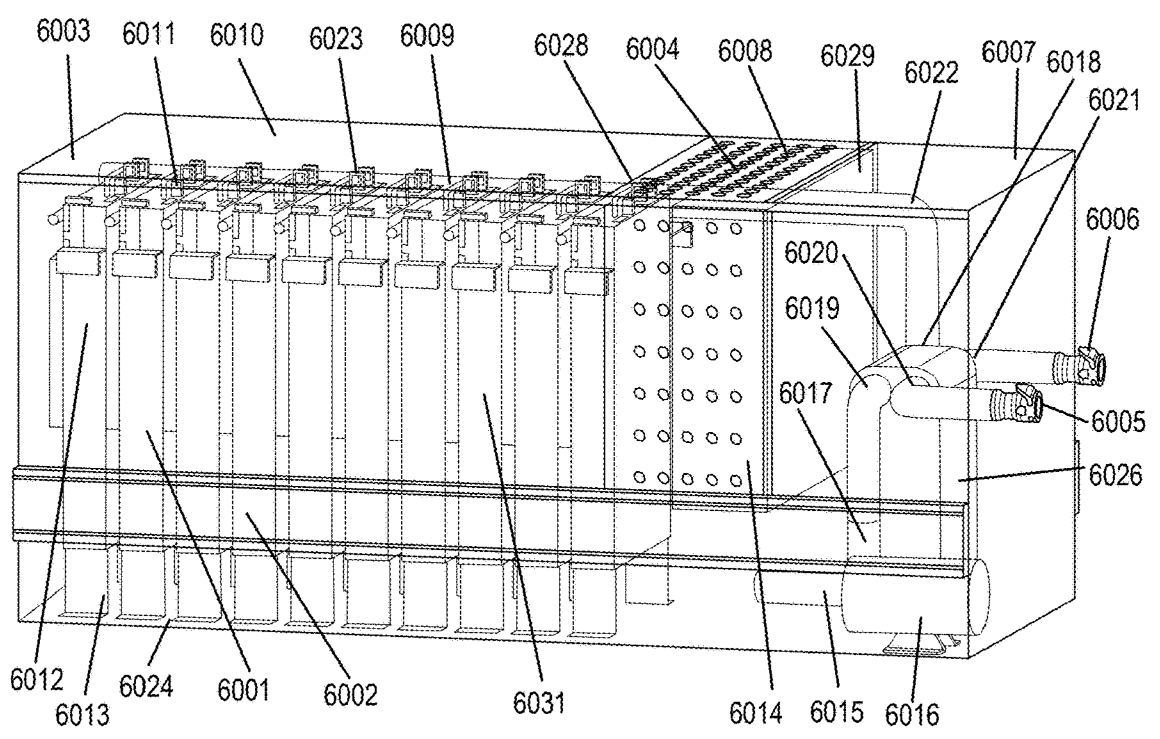
FIGS. 6A through 6D illustrate an exemplary thermal management system comprising sprayers to provide liquid spray cooling to computer servers, in accordance with the embodiment of the present invention.
Figure 6B:
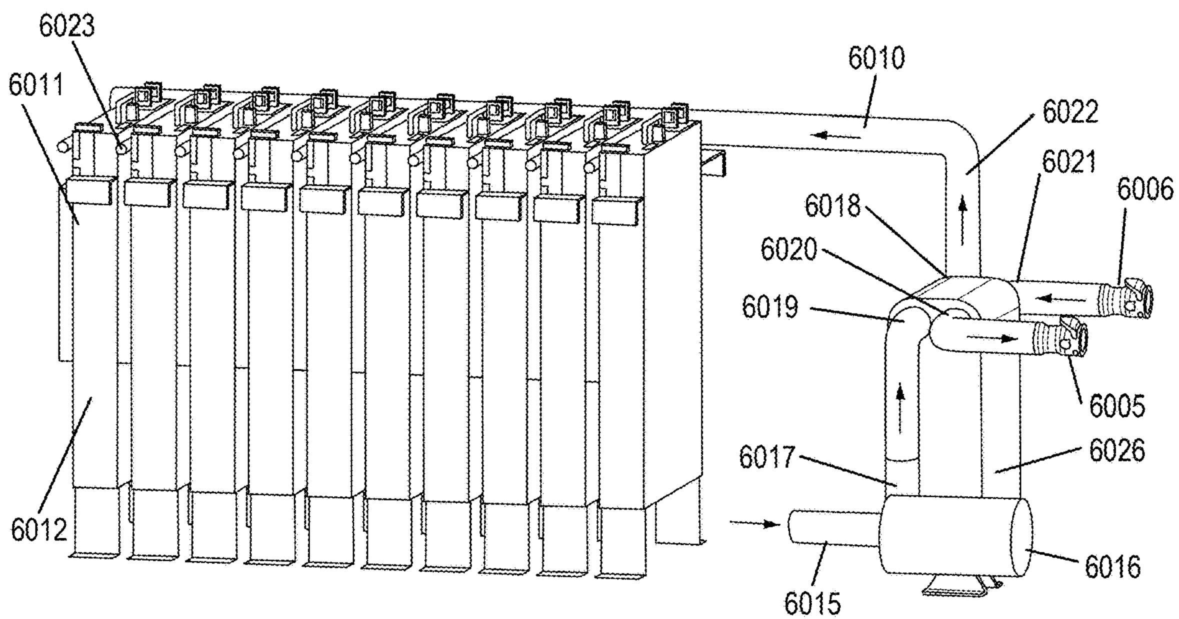
Figure 6C:
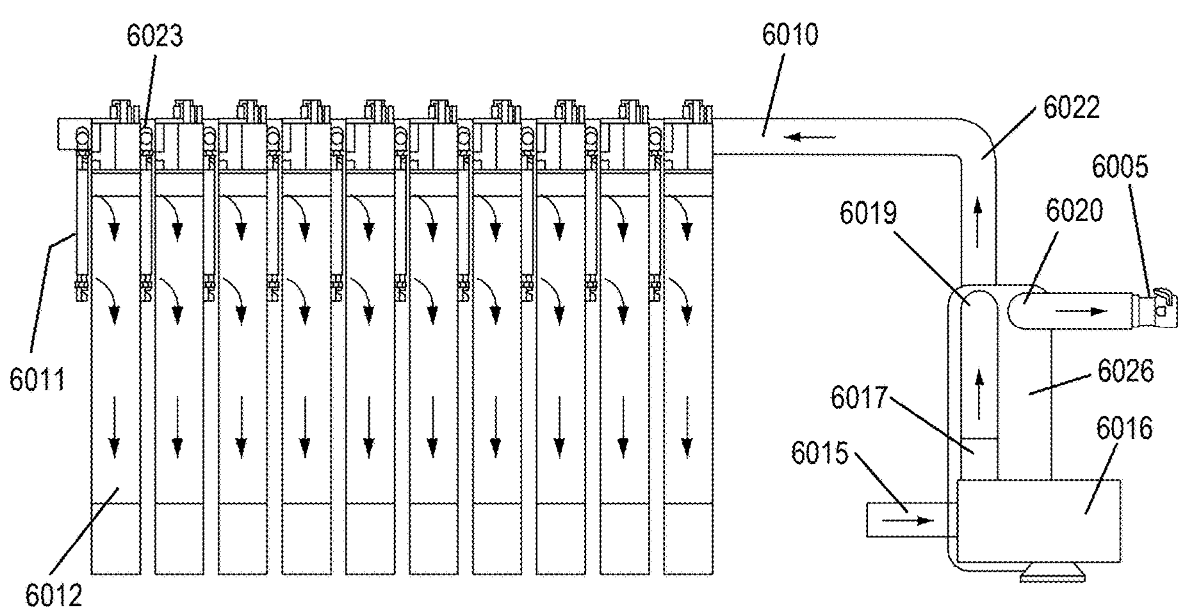
Figure 6D:
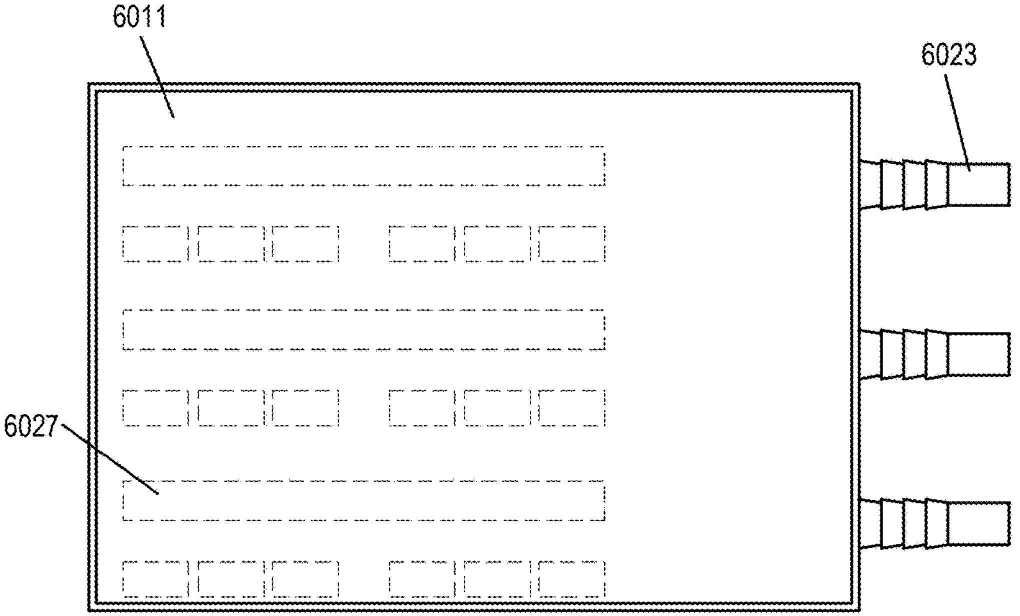

FIGS. 6A through 6D illustrate an exemplary thermal management system comprising sprayers 6011 to provide liquid spray cooling to computer servers 6012, in accordance with the embodiment of the present invention. FIG. 6A is a partially transparent side perspective view of the thermal management system. FIG. 6B is a side perspective view of a coolant circulation system within the thermal management system. FIG. 6C is a front view of the spray cooling mechanism, and FIG. 6D is a bottom view of an exemplary sprayer 6011. In the present embodiment, a housing 6001 and a cover 6003 form a chamber, which may be separated into three sections, a heat exchanger/pump section 6007, an electrical power section 6008, and a spray cooling section 6009 by dividers 6028 and 6029. Each section is isolated from the other sections. Sliding rails 6002 may be disposed on the outer surface of housing 6001. A coolant supply header 6010, sprayers 6011, computer servers 6012, a supporting frame 6013, a pump suction port 6015, spray coolant sub supply lines 6023, and a reservoir 6024 may be included in spray cooling section 6009. In typical use of the present embodiment coolant liquid from coolant supply header 6010 flows into the spray coolant sub supply lines 6023 of sprayers 6011 and is then pushed through holes 6027 disposed in the bottom of sprayers 6011. The cold coolant liquid from the sprayers 6011 may be sprayed into the computer servers 6012 from the sides in a certain pattern to carry the heat away from servers 6012. The heated coolant liquid may then be collected in reservoir 6024 under the computer servers 6012.

The spray cooling section 6009 can hold more than one computer server 6012, relevant sprayers 6011 and other components including, but not limited to, supporting frame 6013 and spray coolant sub supply lines 6023. The quantity of servers 6012 that may be placed in spray cooling section 6009 typically depends on the total heat capacity of servers 6012. Multiple servers 6012 and relevant components share the common reservoir 6024, which collects the heated coolant liquid that drains out of servers 6012. The reservoir 6024 may be connected to the pump suction port 6015, which connects to a circulation pump 6016 that may act to pump the liquid from the reservoir 6024 and into a heat exchanger 6026 to re-cool the liquid before being recirculated to the sprayers 6011. The volume of reservoir 6024 would be designed as small as possible mostly based on how effectively the circulation pump 6016 can suction the liquid safely.

The chamber formed by the spray cooling section 6009 and cover 6003 may be made to be airtight to help prevent the loss of coolant liquid by liquid evaporation or droplet drift. In the present embodiment, the servers 6012 are seated vertically into the support frame 6013, and the sprayers 6011 are placed vertically between every two servers 6012. Sprayers 6011 may spray the coolant liquid onto the sides of servers 6012 laterally, and then gravity will cause the coolant liquid to flow laterally down the sides of the servers 6012 and into the reservoir 6024. The supporting frame 6013 comprises holes through which the coolant liquid can flow through. The coolant supply header 6010 may be connected with one or more spray coolant sub supply lines 6023 connected to each sprayer 6011. The spray coolant sub supply line 6023 could be made from flexible tubes, by which the sprayers 6011 could be pushed upward or to the side to remove the servers 6012 for service purposes. Alternate embodiments may be implemented without flexible tubes.

In the present embodiment, the holes 6027 in the sprayers 6011 may be patterned to match the correct mass flow distribution to the heat flow distribution on the heat sinks. The coolant liquid exiting sprayers 6011 may approach fins 6031 of the heat sink along the longitudinal direction of heat sink fins 6031 at a certain speed to wet the surface of fins 6031, flush the surface of the fins 6031 from top to bottom, and drip into the reservoir 6024. There are many heat sinks in a server, the surface of fins 6031 generally refer to all surface of heat sinks, which may include, without limitation, the heat sink of the CPU, the heat sink of graphic card, or power sources. During this flow process, spray momentum and gravity work together to increase the forced convective heat transfer coefficient as compared to the natural convective heat transfer coefficient in liquid immersive tub solutions.

The electrical power section 6008 may be located beside the spray cooling section 6009. The original power source modules 6014 may be removed from servers 6012 and placed in the electrical power section 6008. The cooling medium in the electrical power section 6008 is air, which may be driven by the fans in the power source modules 6014 through ventilation holes 6004. Moving power source modules 6014 out of the spray cooling section 6009 may enable the present embodiment to take advantage of the higher maximum working temperature of the servers 6012 and may allow the liquid coolant in the spray cooling section 6009 to reach a higher temperature when absorbing heat from the servers. In addition, higher heat recovery temperature and more recovery power could be achieved by cooling the power sources and miner chips separately as explained previously with regard to other embodiments.

The heat exchanger/pump section 6007 may be placed beside the electrical power section 6008. The internal volume of the heat exchanger/pump section 6007 may hold pump suction port 6015, circulation pump 6016, a pump discharging port 6017, a spraying coolant heat exchanger outlet 6018, a spraying coolant heat exchanger inlet 6019, a coolant heat exchanger outlet 6020, a coolant heat exchanger inlet 6021, a spraying coolant supply line 6022, a filter, and heat exchanger 6026.

The heated coolant liquid that ends up in reservoir 6024 may be suctioned into the pump suction port 6015, which may be located under the electrical power section 6008 and connected to spray cooling section 6009. Circulation pump 6016 may be mounted at the bottom of housing 6001 and may pump the coolant liquid out through pump discharging port 6017. The circulation pump 6016 could be virtually any type of pump that meets the requirements of the system. The coolant liquid exiting the pump discharging port 6017 may be pushed into the spraying coolant heat exchanger inlet 6019 as the first fluid to be cooled by a second fluid in the heat exchanger 6026. The cold coolant liquid (as the first fluid) exits the heat exchanger 6026 via the spraying coolant heat exchanger outlet 6018 and may then be pumped into the spraying coolant supply line 6022, which is connected to coolant supply header 6010. The cold coolant liquid from coolant supply header 6010 may then be distributed into the spray coolant sub supply lines 6023 to be sprayed through sprayers 6011. The second fluid flows into heat exchanger 6026 through coolant heat exchanger inlet 6021 and flows out through coolant heat exchanger outlet 6020. The second fluid may be supplied externally through a dripless connector outlet 6005 and a dripless connector inlet 6006. The coolant liquid could be virtually any type of single-phase dielectric fluids, such as, but not limited to, mineral oil, natural/synthetic ester oil, silicone oil, Fluorinert fluids, etc.

Figure 7A:
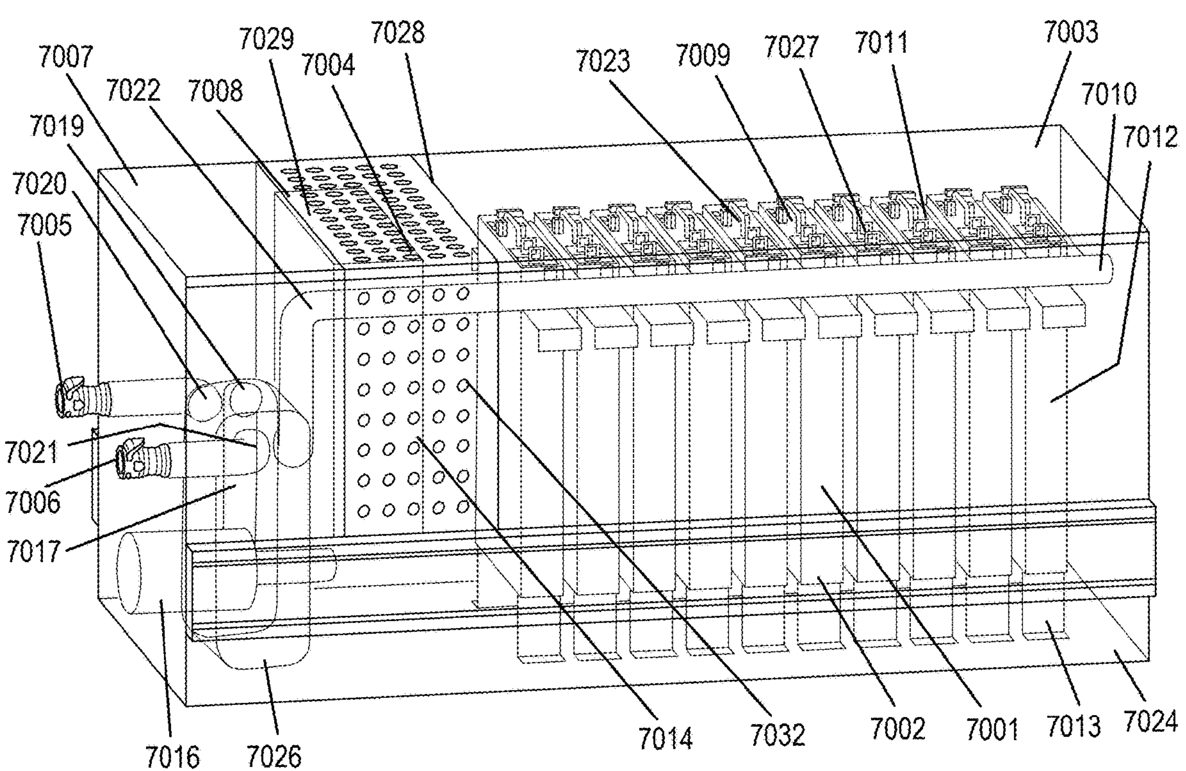
FIGS. 7A through 7D illustrate an exemplary thermal management system comprising spray nozzles 7011 to provide liquid spray cooling to computer servers 7012, in accordance with the embodiment of the present invention.
Figure 7B:
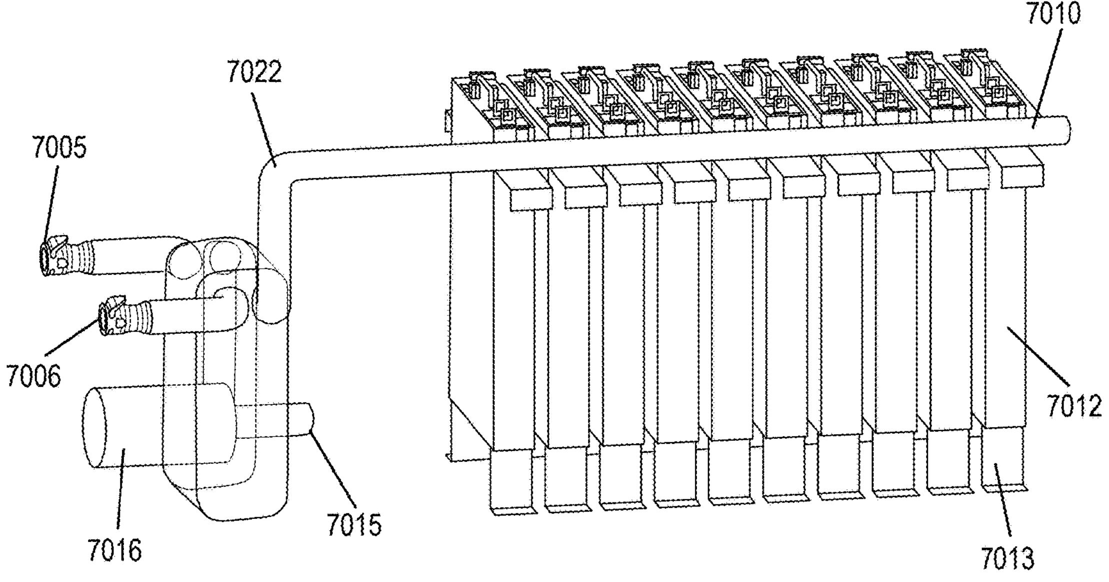
Figure 7C:
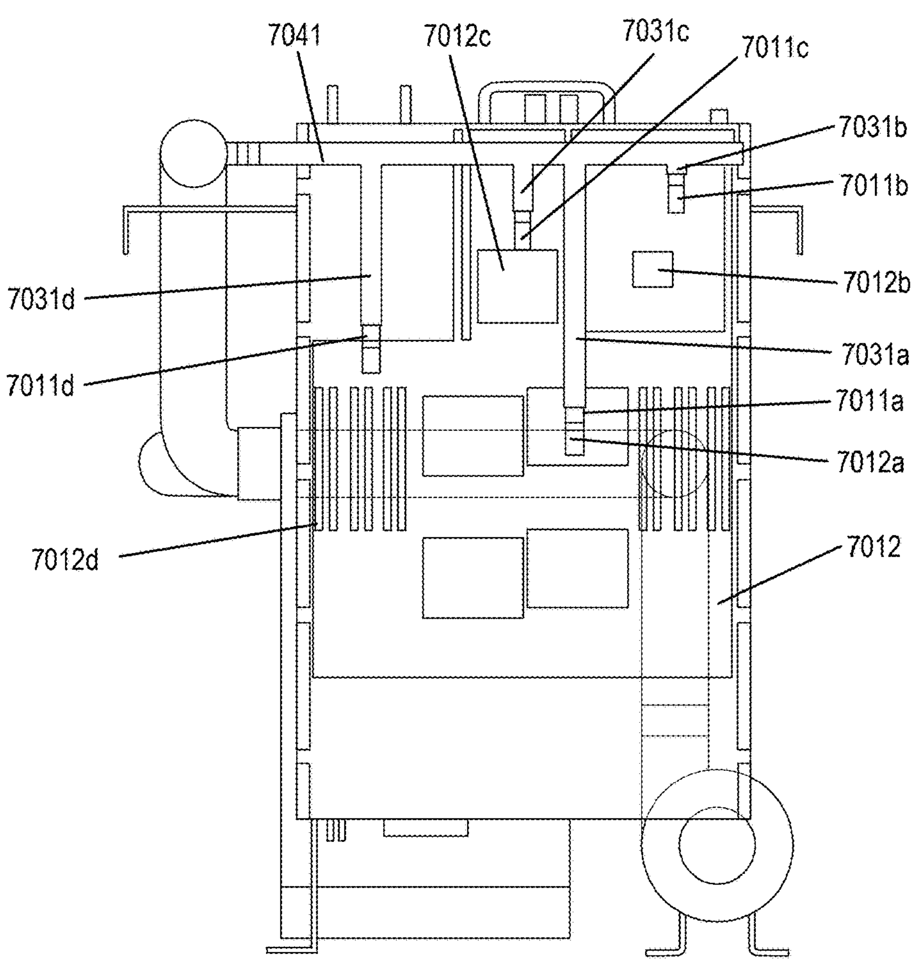
Figure 7D:
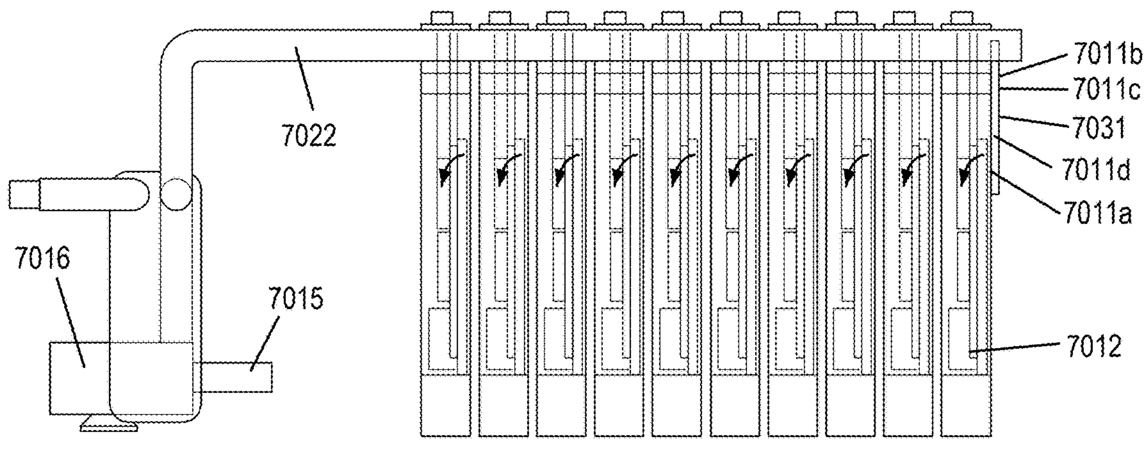

FIGS. 7A through 7D illustrate an exemplary thermal management system comprising spray nozzles 7011 to provide liquid spray cooling to computer servers 7012, in accordance with the embodiment of the present invention. FIG. 7A is a partially transparent side perspective view of the thermal management system. FIG. 7B is a side perspective view of a spraying subsystem within the thermal management system. FIG. 7C is a side view of the spraying subsystem, and FIG. 7D is a front view of the spray cooling mechanism. In the present embodiment, a housing 7001 and cover 7003 form a chamber, which may be separated into three sections, a heat exchanger/pump section 7007, an electrical power section 7008, and a spray cooling section 7009, by dividers 7028 and 7029. Each section may be isolated from each of the other sections. Sliding rails 7002 may be disposed on the outer surface of housing 7001. A coolant supply header 7010, spray nozzles 7011, computer servers 7012, a supporting frame 7013, a pump suction port 7015, spray coolant sub supply lines 7023, and a reservoir 7024 may be included in spray cooling section 7009. In typical use of the present embodiment, coolant liquid coming from coolant supply header 7010 may flow into the spray coolant sub supply lines 7023 of spray nozzles 7011 to then be sprayed through the spray nozzles 7011. The cold coolant liquid from the spray nozzles 7011 may be sprayed into the computer servers 7012 to carry the heat away from servers 7012. The heated coolant liquid may be collected in reservoir 7024 under the computer servers 7012.

The spray cooling section 7009 can hold more than one computer server 7012, relevant spray nozzle 7011 and other components including, but not limited to, supporting frame 7013 and spray coolant sub supply lines 7023. The multiple computer servers 7012 and relevant components share the common reservoir 7024. The reservoir 7024 may be connected to the pump suction port 7015, which connects to a circulation pump 7016 that may act to pump the liquid from the reservoir 7024 and into a heat exchanger 7026 to re-cool the liquid before being recirculated to the nozzles 7011. The volume of reservoir 7024 may be designed as small as possible mostly based on how effectively the pump 7016 can suction the liquid safely.

The chamber formed by the spray cooling section 7009 and cover 7003 may be airtight to help prevent the loss of coolant liquid by liquid evaporation or droplet drift. The spray nozzles 7011 may be located at the sides of a computer servers 7012 so that nozzles 7011 are placed between every two computer servers 7012, which may enable the coolant liquid to be sprayed laterally onto computer servers 7012. The coolant supply header 7010 may be connected to one or more spray coolant sub supply lines 7023 for each spray nozzle 7011. The spray coolant sub supply lines 7023 may be made from flexible tubes or may be made of other types of materials such as, but not limited to rigid tubes. The computer servers 7012 can be seated on the supporting frame 7013 in a vertical orientation, and the supporting frame 7013 may comprise holes to let the coolant liquid flow through to the reservoir 7024.

In the present embodiment, the spray nozzles 7011 may be configured to match the correct mass flow distribution to the heat flow distribution on the heat sink. The coolant liquid exiting spray nozzles 7011 may approach the fins 7032 of the heat sinks laterally at a certain speed, wet the surface of fins 7032, flush the surfaces of the fins 7032 from top to bottom, and drip to the reservoir 7024. While fins 7032 are shown in the present embodiment, and other fins are shown in other embodiments illustrated by way of example in the drawings, there may be many heat sinks in a server, for example, without limitation the heat sink of the CPU, the heat sink of graphic card, or power sources, etc. and fins in alternate embodiments may be located in different areas of the server. In the present embodiment, during this flow process, spray momentum and gravity work together to increase the forced convective heat transfer coefficient as compared to the natural convective heat transfer coefficient in liquid immersive tub solutions. More specifically, the spray nozzles 7011 could be arranged according to the location of heat sources. Referring to FIG. 7C, nozzles 7011_a_, 7011_b_, 7011_c_ and 7011_d_ are located by the position of servers (i.e., heat sources) 7012_a_, 7012_b_, 7012_c_ and 7012_d_ respectively. Since the coolant liquid approaches the heat sink on servers 7012 laterally, the location of nozzles 7011 may be placed higher than the geometrical center of the heat sinks regarding the composition of gravity and spraying momentum. The exact comparative position between nozzles 7011 and the heat sinks depends mostly on the type of heat sink and the type of nozzles 7011. As illustrated by way of example in FIG. 4, different nozzles can have different spraying angles, speeds, sizes, and flowrates. It is contemplated that the coordination between heat sinks and nozzles will likely be done on a system-by-system basis. In the present embodiment four branches 7031_a_, 7031_b_, 7031_c_, and 7031_d_ are shown to supply fluid to nozzles 7011. The positions of branches 7031_a_, 7031_b_, 7031_c_, and 7031_d_ typically rely on the locations of heat sources. Referring to FIG. 7C, a liquid supply header 7041 for each server is connected with a spraying coolant supply line 7022. The liquid in liquid supply header 7041 may be divided into several branches 7031_a_, 7031_b_, 7031_c_ and 7031_d_ to supply fluid to nozzles 7011_a_, 7011_b_, 7011_c_, and 7011_d_. In alternate embodiments, more branches may be included based on the heat resources in the motherboard.

The original power source modules 7014 may be removed from servers 7012 and placed in the electrical power section 7008. The cooling medium in the electrical power section 7008 is air, which may be driven by fans in the power source modules through the ventilation holes 7004. Moving power source modules 7014 out of the spray cooling section 7009 may enable the present embodiment to take advantage of the higher maximum working temperature of the servers 7012 and may allow the liquid coolant in the spray cooling section 7009 to reach a higher temperature when absorbing heat from the servers. In addition, higher heat recovery temperature and more recovery power could be achieved by cooling the power sources and miner chips separately as explained previously with regard to other embodiments.

The internal volume of the heat exchanger/pump section 7007 may hold pump suction port 7015, circulation pump 7016, a pump discharging port 7017, a spraying coolant heat exchanger outlet 7018, a spraying coolant heat exchanger inlet 7019, a coolant heat exchanger outlet 7020, a coolant heat exchanger inlet 7021, a spraying coolant supply line 7022, a filter, and heat exchanger 7026. The heated coolant liquid in reservoir 7024 may be suctioned into the pump suction port 7015, which is located under the electrical power section 7008 and connected to spray cooling section 7009. Circulation pump 7016 may be mounted at the bottom plate of housing 7001 and may pump the coolant liquid out of pump discharging port 7017. The circulation pump 7016 could be virtually any type of pump that meets the required flow and header of the system. The coolant liquid exiting the pump discharging port 7017 may then be pushed to the spraying coolant heat exchanger inlet 7019 as the first fluid to be cooled by the second fluid in the heat exchanger 7026. The cold coolant liquid (as the first fluid) exiting the spraying coolant heat exchanger outlet 7018 may then be pumped into the spraying coolant supply line 7022, which is connected to coolant supply header 7010. The cold coolant liquid from coolant supply header 7010 may then be distributed to the spray coolant sub supply lines 7023 and then sprayed through nozzles 7011. The second fluid flows into heat exchanger 7026 through coolant heat exchanger inlet 7021 and flows out through coolant heat exchanger outlet 7020. The second fluid may be supplied externally through a dripless connector outlet 7005 and a dripless connector inlet 7006. The coolant liquid could be virtually any type of single-phase dielectric fluids, such as, but not limited to, mineral oil, natural/synthetic ester oil, silicone oil, or Fluorinert fluids.

Figure 8A:
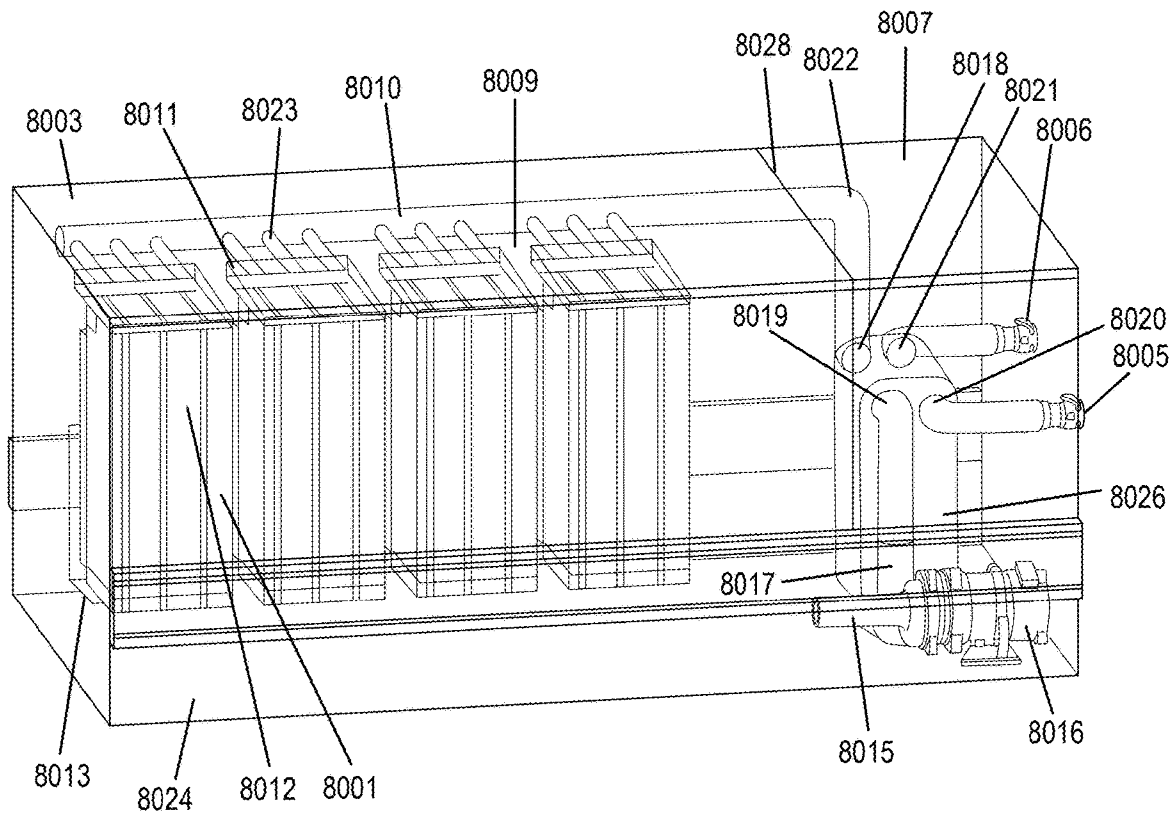
FIGS. 8A through 8C illustrate an exemplary two-chamber thermal management system that may provide liquid spray cooling to IT components, in accordance with the embodiment of the present invention.
Figure 8B:
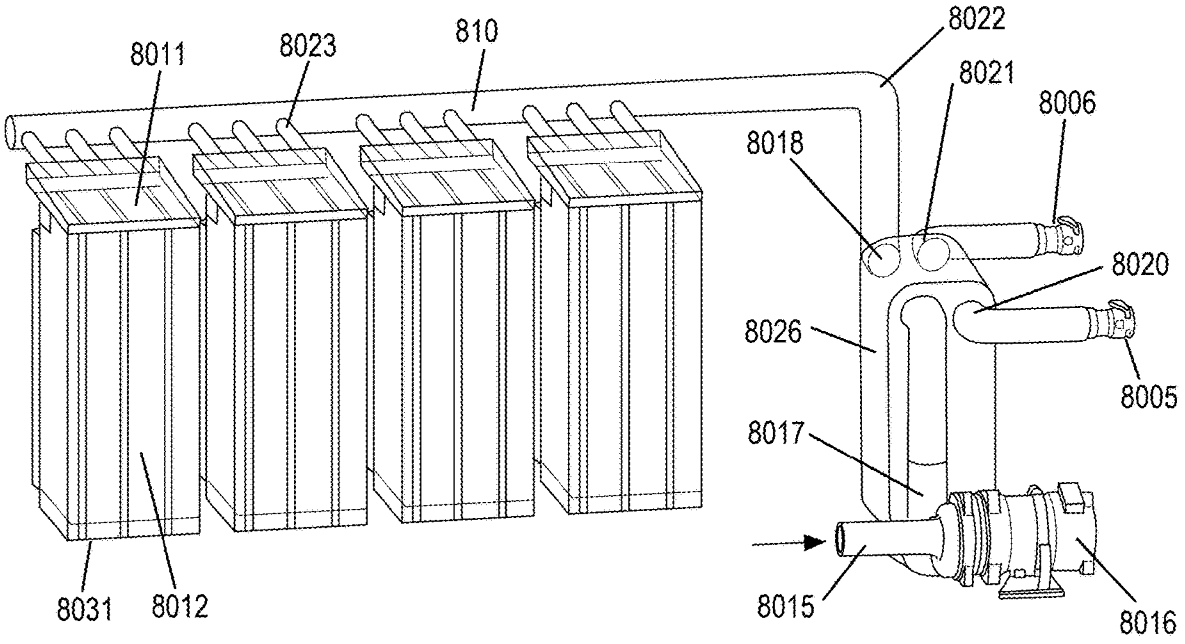
Figure 8C:
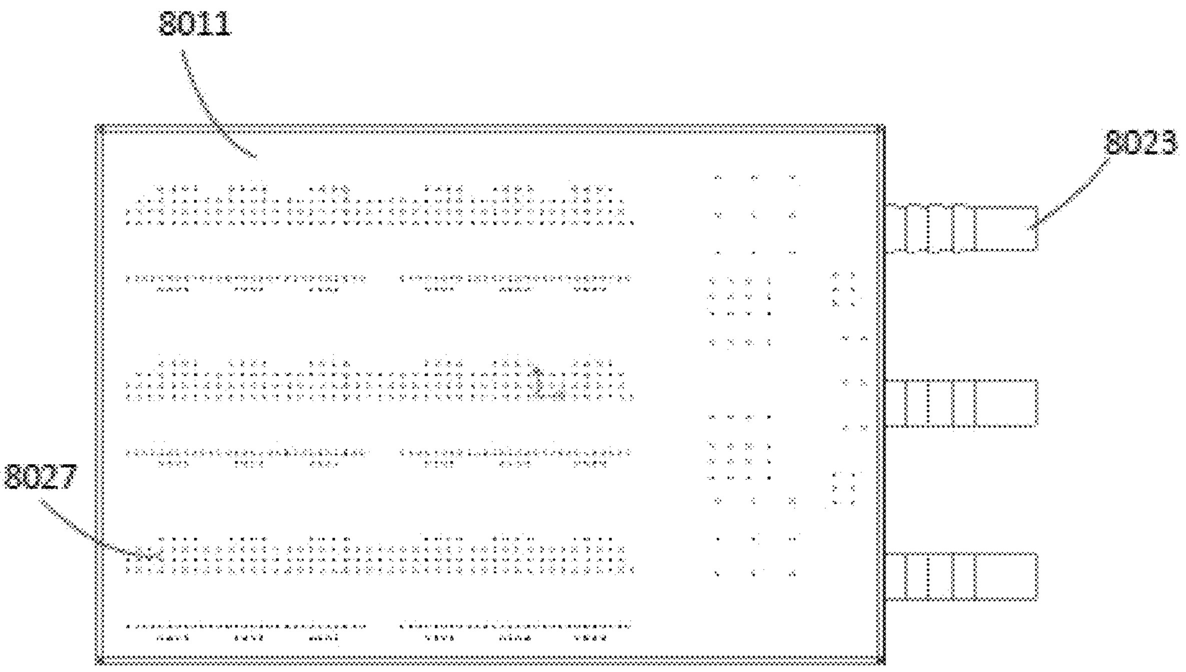

FIGS. 8A through 8C illustrate an exemplary two-chamber thermal management system that may provide liquid spray cooling to IT components, in accordance with the embodiment of the present invention. FIG. 8A is a partially transparent side perspective view of the thermal management system. FIG. 8B is a side perspective view of a coolant circulation system within the thermal management system, and FIG. 8C is a bottom view of an exemplary sprayer 8011. In the present embodiment, a housing 8001 comprises two sections, a heat exchanger/pump section 8007, and a spray cooling section 8009, which are separated by a divider 8028. Each section is isolated from the other. A sliding rail 8002 may be included on the exterior of housing 8001. A. coolant supply header 8010, sprayers 8011, miners 8012, a supporting frame 8013, a pump suction port 8015, a spray coolant sub supply line 8023, and a reservoir 8024 may be included in spray cooling section 8009. In typical use of the present embodiment coolant liquid from coolant supply header 8010 flows into the spray coolant sub supply lines 8023 of each sprayer 8011 and may then be pushed through spray holes 8027 in sprayers 8011. The cold coolant liquid from the spray holes 8027 may be sprayed downward into the miners 8012 underneath in a certain pattern to carry the heat away from miners 8012. The heated coolant liquid may then be collected in reservoir 8024 under the miners 8012.

The spray cooling section 8009 can hold more than one miner 8012, relevant sprayer 8011 and other components including, without limitation, supporting frame 8013 and spray coolant sub supply lines 8023. The quantity of miners may depend on the total heat capacity of miners 8012. Multiple miners 8012 and relevant components share the common reservoir 8024, which collects the heated coolant liquid dripped out of miners 8012. The reservoir 8024 may be connected to the pump suction port 8015, which connects to a circulation pump 8016 that may act to pump the liquid from the reservoir 8024 and into a heat exchanger 8026 to re-cool the liquid before being recirculated to the sprayers 8011. The volume of reservoir 8024 may be designed to be as small as possible mostly based on the ability of the circulation pump 8016 to suction liquid safely.

The chamber formed by the spray cooling section 8009 and a cover 8003 may be made airtight to help prevent the loss of coolant liquid by liquid evaporation or droplet drift. The sprayers 8011 may be located above miner 8012 to generally ensure that coolant liquid can be sprayed downward at a straight angle. The coolant supply header 8010 may be connected with one or more spray coolant sub supply lines 8023 of each sprayer 8011. In some embodiments, the spray coolant sub supply lines 8023 could be made from flexible tubes, which may enable the sprayers 8011 to be pushed upward or outward to provide access to remove the miners 8012 for service purposes. The miners 8012 may be seated on the supporting frame 8013 in a vertical orientation, and supporting frame 8013 may comprise holes or openings to let the coolant liquid flow through and into the reservoir 8024 below.

The spray holes 8027 in sprayers 8011 may be patterned to match the correct mass flow distribution to the heat flow distribution on the heat sinks. The coolant liquid out of sprayers 8011 may approach fins 8031 on the heat sinks vertically (i.e., perpendicular to the horizon) at a certain speed, wet the surface of fins 8031, flush the surfaces of fins 8031 from top to bottom in a longitudinal direction, and drip to the reservoir 8024. During this flow process, spray momentum and gravity work together to increase the forced convective heat transfer coefficient as compared to the natural convective heat transfer coefficient in liquid immersive tub solutions. This embodiment cools the electronic devices (i.e., miners 8012) together with their electrical power sources. Referring to the aforementioned maximum temperature discrepancy, the power sources typically cannot work at the higher maximum temperature of miners 8012. Therefore, in this design, the spraying coolant liquid temperature meets the requirements of the lower limits of electrical power sources. This design may be applicable for the lower tier energy efficiency data center applications and cryptocurrency mining rack and farm applications.

The internal volume of the heat exchanger/pump section 8007 may hold pump suction port 8015, circulation pump 8016, a pump discharging port 8017, a spraying coolant heat exchanger outlet 8018, a spraying coolant heat exchanger inlet 8019, a coolant heat exchanger outlet 8020, a coolant heat exchanger inlet 8021, a spraying coolant supply line 8022, a filter, and heat exchanger 8026. The circulation pump 8016 may be virtually any type of pump that meets the flow and header needs of the system. Within the heat exchanger/pump section 8007, the heated coolant liquid from reservoir 8024 may be suctioned into the pump suction port 8015, which is located at the bottom of reservoir 8024 and connected to spray cooling section 8009. Circulation pump 8016 pumps the coolant liquid out through pump discharging port 8017 into the spraying coolant heat exchanger inlet 8019 as the first fluid in the heat exchanger 8026 to be cooled by a second fluid in the heat exchanger 8026. The cold coolant liquid (as the first fluid) exits heat exchanger 8026 through spraying coolant heat exchanger outlet 8018 and it then pumped into the spraying coolant supply line 8022, which is connected to coolant supply header 8010. The cold coolant liquid from coolant supply header 8010 may then be distributed into the spray coolant sub supply lines 8023 to then be sprayed through sprayers 8011. The second fluid flows into heat exchanger 8026 through coolant heat exchanger inlet 8021 and flows out of heat exchanger 8026 through coolant heat exchanger outlet 8020. The second fluid may be supplied externally through a dripless connector outlet 8005 and a dripless connector inlet 8006. The coolant liquid could be any type of single-phase dielectric fluids, such as, but not limited to, mineral oil, natural/synthetic ester oil, silicone oil, Fluorinert fluids, etc.

Embodiments of the present invention related to data center heat reuse systems will now be described. One such embodiment may provide a data center heat reuse system with a thermal stabilizer that is a combo system with active and passive stabilizers. It is contemplated that, with this type of system, the constant temperature of coolant can be maintained for the end user, and improved efficiency can be provided. The establishment of a passive stabilizer through thermal storage by a phase change material can be realized by the availability of a constant phase change temperature and a large latent heat. A heat pump may act as the active stabilizer by its characteristics of variable speed driving. A storage tank may act as a thermal energy center in which thermal exchange can happen among coils within the storage tank instead of in serial or parallel mode as is common in current approaches. The storage tank may be integrated with a temperature stabilizer to provide a stable temperature supply to the end user. The storage tank may comprise the passive phase change energy storage and the active heat pump temperature stabilizing mechanism. It is contemplated that a system as described here can provide multiple functions for heating and cooling simultaneously and may function with high energy efficiency. In some embodiments, the data center heat reuse system may be configured with a compact size.

Figure 9:
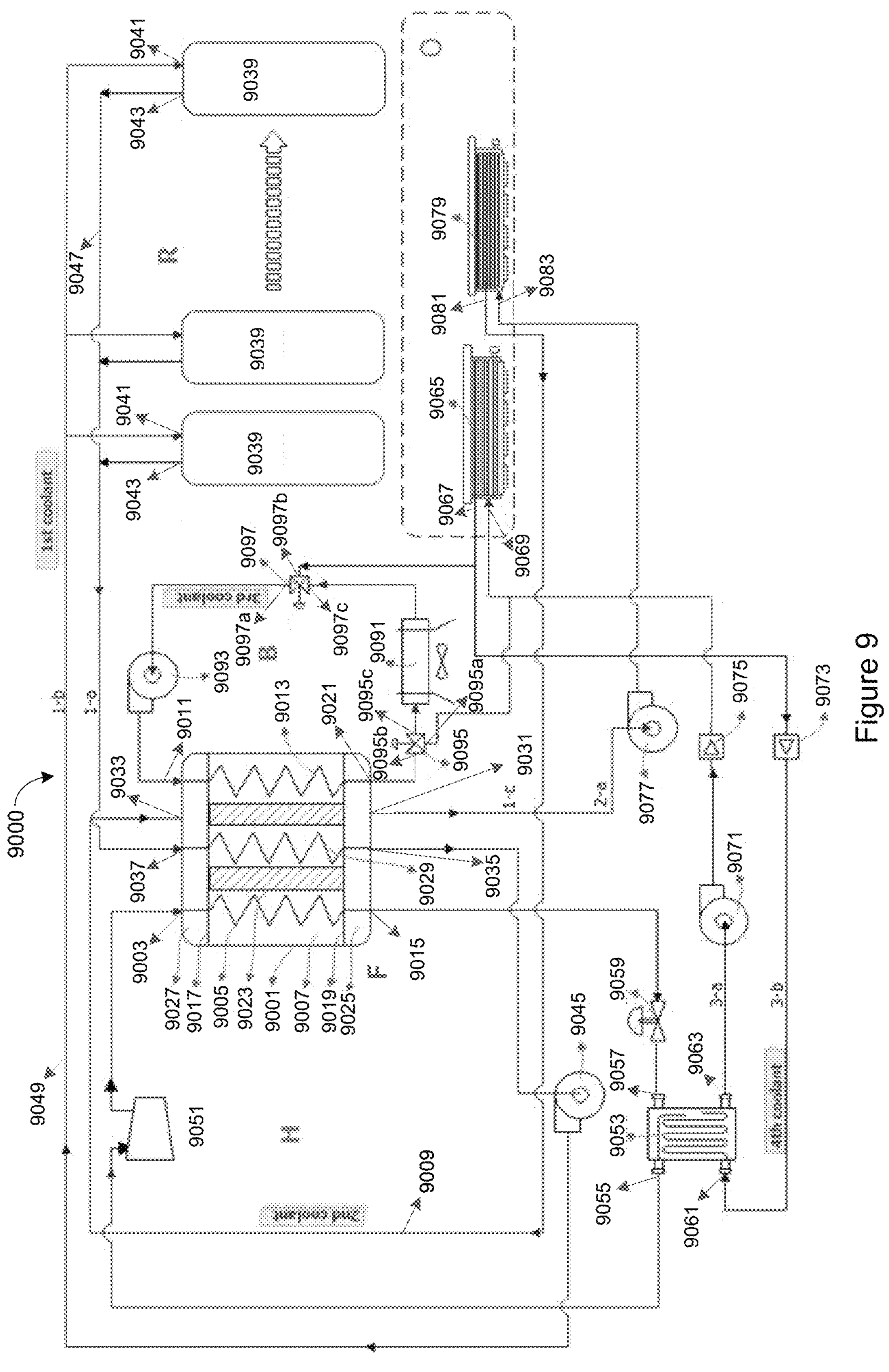
FIG. 9 is a systemic diagram of an exemplary data center heat reuse system, in accordance with an embodiment of the present invention.

FIG. 9 is a systemic diagram of an exemplary data center heat reuse system 9000, in accordance with an embodiment of the present invention. In the present embodiment, system 9000 comprises five subsystems. These subsystems are a liquid cooling in a data center subsystem R with a $1^{st}$ coolant; a thermal storage tank subsystem F with a $2^{nd}$ coolant; a room air conditioning subsystem O with a $4^{th}$ coolant; a heat pump subsystem H with a refrigerant, and a heat dissipation subsystem B with a $3^{rd}$ coolant.

Subsystem F can be considered as the thermal storage tank with an insulation layer attached to store thermal energy from subsystem R and subsystem H. Subsystem F comprises a thermal storage tank 9001. Thermal storage tank 9001 may comprise a refrigerant inlet 9003 for a condenser coil 9005 which is part of subsystem H, an internal volume 9007 filled with the $2^{nd}$ coolant, a cooling coil inlet 9011 for a cooling coil 9013 which is part of subsystem B, a refrigerant outlet 9015 for condenser coil 9005, two $2^{nd}$ coolant distribution plates 9017 and 9019, a cooling coil outlet 9021, encapsulated phase change material 9023, an outlet plenum 9025, an inlet plenum 9027, a heating coil 9029, a plenum outlet port 9031, a plenum inlet port 9033, a heating coil outlet 9035, and a heating coil inlet 9037. In some embodiments, the thermal storage tank may be thermally insulated by an insulation layer that may comprise a multiplicity of suitable insulating materials such as, but not limited to, fiberglass blankets, air gaps, etc.

Subsystem F works generally as thermal storage and distribution volume for the full heat reuse system, while also serving to stabilize the temperature fluctuation of the system by its large thermal volume. Thermal storage tank 9001 houses three independent coils, condenser coil 9005, heating coil 9029, and cooling coil 9013, immersed in the $2^{nd}$ coolant, which is a liquid coolant. Thermal storage tank also houses encapsulated phase change material 9023. Heating coil 9029 connects to subsystem R near heating coil inlet 9037 and heating coil outlet 9035 so that the $1^{st}$ coolant flows through subsystem R and through heating coil 9029 in a closed loop. Similarly, condenser coil 9005 connects to subsystem H at refrigerant inlet 9003 and refrigerant outlet 9015. The $2^{nd}$ coolant enters thermal storage tank 9001 through plenum inlet port 9033 and flows into inlet plenum 9027 to be distributed evenly within internal volume 9007 of thermal storage tank 9001 around condenser coil 9005, heating coil 9029, cooling coil 9013, and phase change material 9023. This may enable the thermal energy fluctuations from Subsystem R to be transferred through the wall of heating coil 9029 to the $2^{nd}$ coolant. In addition, the condensing heat being carried by the refrigerant circulating through the heat pump circuit of subsystem H may be rejected into the $2^{nd}$ coolant through the wall of condenser coil 9005 from the refrigerant. To counteract the fluctuations from subsystem R obtained through heating coil 9029, a compressor 9051 driven by a variable speed driver can be modulated based on the setting temperature at the port of outlet plenum F.11. After completing the heat transfer, the $2^{nd}$ coolant may be collected by outlet plenum 9025 and pumped out through plenum outlet port 9031. For example, if the setting temperature at plenum outlet port 9031 is 60° C., the running speed of compressor 9037 may be adjusted to maintain the stability of this temperature. This is the mechanism referred to here as the active stabilizer. In regard to phase change material 9023 immersed in the $2^{nd}$ coolant within internal volume 9007, its latent heat absorbing or releasing during phase change is much higher than that of the $2^{nd}$ coolant, and its temperature during the phase change can be kept stable. As a result, phase change material 9023 can help maintain the temperature of $2^{nd}$ coolant at a stable point by its characteristic of phase change, which is herein referred to as the passive stabilizer. It is believed that this mitigation of the temperature fluctuation of subsystem R by moderating subsystem H may provide stable hydraulic conditions for all subsystems. It is contemplated that phase change material 9023 can be encapsuled into a beam, ball, or any other geometrical volume to typically ensure it is physically isolated but thermally coupled with the $2^{nd}$ coolant by being encapsulated in a material that allows for heat conduction between phase change material 9023 and the $2^{nd}$ coolant. The type of phase change material to be used in the system may be selected based on various properties including, without limitation, its latent heat, heat conductivity, phase change temperature, density, thermal expansion coefficient, etc. The quantity of phase change material to be deployed depends on the requirements of the thermal capacitor versus the capital investment. Condenser coil 9005, heating coil 9029, and cooling coil 9013 can be any kind of heat transferring surface, such as, but not limited to, copper tube, spiral coil, finned tube, plates, etc. as long as the fluids at two sides are not blended, and heat transferring between the fluids is possible. In the present embodiment, $1^{st}$ coolant, $2^{nd}$ coolant, $3^{rd}$ coolant, and $4^{th}$ coolant can be the same fluids or different fluids depending on the working conditions of the system.

Referring to subsystem R, which is configured to provide liquid cooling in the data center, in the present embodiment, this subsystem comprises multiple liquid cooling racks 9039 each comprising a coolant inlet port 9041 and a coolant outlet port 9043. A $1^{st}$ coolant circulation pump 9045 is also included in subsystem R. It is contemplated that virtually any number of liquid cooling racks may be incorporated into various embodiments of the present invention. Since the $1^{st}$ coolant loop is thermally coupled but physically isolated from the external system, the scalability of a complex system can be realized easily by adjusting the size of heating coil 9029. Furthermore, liquid cooling racks 9039 can be configured to use various different types of liquid cooling methods including, without limitation, direct-to-chip, immersion (single-phase or two-phase), hybrid methods, etc. In the present embodiment, the $1^{st}$ coolant is circulated through liquid cooling racks 9039 to bring the heat generated by the electronic device out for reuse. The $1^{st}$ coolant coming from liquid cooling racks 9039 that has been heated by the thermal energy being extracted from the electronic device(s) of a data center flows out of coolant outlet ports 9043 to be collected by a $1^{st}$ coolant output manifold 9047 to then flow into the heating coil 9029 to heat the $2^{nd}$ coolant in internal volume 9007 of thermal storage tank 9001. The $1^{st}$ coolant exiting heating coil 9029 is then suctioned into liquid rack $1^{st}$ coolant circulation pump 9045 to be pumped into a $1^{st}$ coolant input manifold 9049 back into the liquid cooling racks 9039. Various different coolants may be used for the $1^{st}$ coolant such as, tub not limited to, dielectric liquid, water, 3M™ Novac™ working fluid, or other types of thermal fluids depending on the type of rack cooling system. From performance, reliability, and cost perspectives, the quantity and quality of $1^{st}$ coolant access to the liquid cooling rack directly may be minimized and optimized respectively by an independent circulation loop. Referring to FIG. 9, subsystem R has been illustrated as a relatively simple liquid cooling system, and it is contemplated that those skilled in the art, in light of the teachings of the present embodiment, will recognize that data center cooling systems for use in data center heat reuse systems according to embodiments of the present invention may be implemented in a multiplicity of suitable configurations. For example, without limitation, the multiple liquid cooling racks may be configured various different arrays to meet the needs of different situations, and circulation pumps and input and output manifolds could be configured into multiple loops based on the requirements of reliability. Furthermore, expansion tanks, valves, strainers, pump protection devices, and fluid control devices commonly seen in the fluid circulation system are not specifically mentioned or shown in this description, however, the use of such components is considered as common knowledge in this industry.

Subsystem H comprises compressor 9051 driven by a variable speed driver, a heat exchanger 9053, a refrigerant outlet 9055 of the evaporating side of heat exchanger 9053, a refrigerant inlet 9057 of the evaporating side of heat exchanger 9053, an expansion valve 9059, and condenser coil 9005. Subsystem H works as a heat pump by the principle of a refrigeration cycle. Compressor 9051 compresses the superheated refrigerant from heat exchanger 9053 into condenser coil 9005, and the condensing heat is discharged from the wall of condenser coil 9005 into the $2^{nd}$ coolant in the internal volume 9007 of thermal storage tank 9001. The heat from condenser coil 9005 is used to maintain the temperature stability of the $2^{nd}$ coolant. More specifically, condenser coil 9005 is submerged in the $2^{nd}$ coolant to maintain its temperature stability. The type of heat transferring between condenser coil 9005 and $2^{nd}$ coolant may be, without limitation, tube-shell, tube-tube, plate-to-plate, etc. Subsystem H may boost the $2^{nd}$ coolant temperature as high as needed to cater to the temperature requirements of end user. Modulation of the speed of compressor 9051 by the variable speed driver may also help maintain a stable condensing temperature, which mitigates the fluctuation of the $2^{nd}$ coolant temperature, by providing an impedance to counteract the temperature variation by detecting the discharging pressure floating away from the setting. Therefore, the compressor speed may typically be controlled by the temperature difference between the $2^{nd}$ coolant and the output setting. The capacity of this heat pump subsystem should be large enough to eliminate or mitigate the temperature variation only. After the heat is discharged from the refrigerant in condenser coil 9005, the condensed liquid exiting condenser coil 9005 may be throttled by expansion valve 9059 and then heated in the evaporating side of heat exchanger 9053 by the heat coming from the cooling side of heat exchanger 9053. The evaporated vapor out of refrigerant outlet 9055 may be suctioned into compressor 9051 driven by variable speed driver to form a complete cycle, in which the heat absorbed in heat exchanger 9053 is pumped to $2^{nd}$ coolant in subsystem F. The cooling side of heat exchanger 9053 may provide cooling to an end user, for example, without limitation, by cooling the $4^{th}$ coolant in heat exchanger 9053 for room cooling in the room air conditioning subsystem O.

In the present embodiment, subsystem O is a room air conditioning subsystem with a $4^{th}$ coolant that comprises a coolant inlet 9061 of the $4^{th}$ coolant to heat exchanger 9053, a coolant outlet 9063 of the $4^{th}$ coolant from heat exchanger 9053, a cooling fan coil 9065, a coolant outlet 9067 from cooling fan coil 9065, a coolant inlet 9069 to cooling fan coil 9065, a $4^{th}$ coolant circulation pump 9071, a $4^{th}$ coolant return check valve 9073, a $4^{th}$ coolant supply check valve 9075, a $2^{nd}$ coolant circulation pump 9077, a heat fan coil 9079, an outlet port 9081 of heating fan coil 9079, and an inlet port 9083 of heating fan coil 9079. It is contemplated that a simplified version of this system may be formed by coolant inlet 9061, coolant outlet 9063, coolant circulation pump 9077, coolant return check valve 9073, coolant inlet 9069 of cooling fan coil 9065, coolant outlet 9067 of cooling fan coil 9065, and the $4^{th}$ coolant can be replaced by a direct expansion system. In this simplified system, refrigerant inlet 9057 may be connected to coolant inlet 9069, and refrigerant outlet 9055 may be connected to coolant outlet 9067, and heat exchanger 9053 may be replaced by cooling fan coil 9065.

Referring to FIG. 9, in the present embodiment subsystem O mimics a real load scenario requiring heating and cooling simultaneously or independently, wherein the heating and cooling capacity from subsystem H in addition to the heating capacity from subsystem R can be redistributed into subsystem O, as the end user of thermal energy. Cooling fan coil 9065 may provide its cooling capacity to the space in the subsystem O, and heat fan coil 9079 may provide its heating capacity to the space in the subsystem O. Alternatively, cooling fan coil 9065 can be switched to heat the space enclosed in subsystem O if necessary. In refrigeration mode, the cold 4th coolant from pump 9071 may be pumped into cooling fan coil 9065 through coolant inlet 9069 and then flow out from cooling fan coil 9065 through coolant outlet 9067. In the heating mode, the system may be configured so that the hot $3^{rd}$ coolant exiting cooling coil 9013 is routed to cooling fan coil 9065 through system B, which will be described further below. By coupling cooling fan coil 9065 and heat fan coil 9079, the thermal conditions in the subsystem O can be controlled precisely, i.e., cooling fan coil 9065 in cooling mode and heat fan coil 9079 in heating mode. Either heating fan coil w.02 or cooling fan coil c.11 can work independently. The $4^{th}$ coolant is cooled by the refrigerant evaporation in the heat exchanger 9053. The cold $4^{th}$ coolant in heat exchanger 9053 may be suctioned by $4^{th}$ coolant circulation pump 9071 out of coolant outlet 9063 of heat exchanger 9053 and driven through coolant supply check valve 9075 into the coolant inlet 9069 to cooling fan coil 9065. A portion of $4^{th}$ coolant exiting cooling fan coil 9065 at coolant outlet 9067 may go to a secondary source of cooling for cooling fan coil 9065, which is subsection B, described further below. The remainder of the exiting $4^{th}$ coolant returns to heat exchanger 9053 to be cooled again. In the scenario of a secondary cooling source, the $4^{th}$ coolant is the same as the $3^{rd}$ coolant, the $4^{th}$ coolant supply check valve 9075 and the $4^{th}$ coolant return check valve 9073 generally prevent the flow of the $4^{th}$ coolant backward to coolant circulation pump 9071. The secondary cooling source for cooling fan coil 9065 may be employed under conditions where extra heating capacity is required by the availability of cooling fan coil 9065. Cooling fan coil 9065 and heating fan coil 9079 can be terminal equipment that delivers the cooling/heating effects to the room respectively. Cooling fan coil 9065 and heating fan coil 9079 may be considered as the intermedia heat exchangers for cooling or heating other coolants as well.

Heat dissipation subsystem B with $3^{rd}$ coolant comprises a dry cooler 9091, a cooling circulation pump 9093, cooling coil 9013, a three-way valve 9095 comprising a port 9095*a*, a port 9095*b* and a port 9095*c*, a second three-way valve 9097 comprising a port 9097*a*, a port 9097*b* and a port 9097*c*. Subsystem B may be employed to dissipate the extra heat into the ambient through dry cooler 9091 when the total heat supply from subsystem R and subsystem H is above the demands from subsystem O. Within subsystem B, $4^{th}$ coolant that has been pumped into cooling coil 9013 through inlet 9011 absorbs heat from $2^{nd}$ coolant within thermal storage tank 9001 to stabilize the temperature of the $2^{nd}$ coolant and flows out through outlet 9021 of cooling coil 9013. The heated $4^{th}$ coolant then flows into port 9095*a* of three-way valve 9095. Functioning at model one, which is the normal heat rejection cycle into the ambient, the $4^{th}$ coolant from port 9095*a* is connected with port 9095*c* of three-way valve 9095 (isolated with port 9095*b* of three-way valve 9095). Meanwhile, port 9097*c* of three-way valve 9097 may be connected with port 9097*a* of three-way valve 9097 (isolated with port 9097*b* of three-way valve 9097). The $4^{th}$ coolant may flow through cooling coil outlet 9021, port 9095*a*, port 9095*c*, dry cooler 9091, port 9097*c*, and port 9097*a* in sequence and finally be suctioned into circulation pump 9093. In this mode, the heat absorbed in cooling coil 9013 may be rejected into the ambient through dry cooler 9091. A second model, which is a heating cycle by which the heat from subsystem R may be rejected into subsystem O, port 9095*a* may be connected with port 9095*b* (isolated with port 9095*c*) while, port 9097*b* may be connected with port 9097*a* (isolated with port 9097*c*). To switch between heating and cooling modes, pumps the pump 9071 and pump 9093 may be stopped so that three-way valves 9097 and 9095 may be switched to make 9097*a* and 9097*b* connected, and 9095*a* and 9095*b* connected simultaneously. In this model, the $3^{rd}$ and the $4^{th}$ coolant may be the same. The hot $3^{rd}$ coolant exiting cooling coil 9013 through outlet 9021 may flow to port 9095*b* then port 9095*a* and into cooling fan 9065 through inlet 9069. Then the cooled $3^{rd}$ coolant would exit through outlet 9067 to flow through 9097*b* then through 9097*a* to be suctioned by pump 9093 back into cooling coil 9013 through inlet 9011. The $4^{th}$ coolant may flow through port 9095*b*, port 9095*c*, coolant return check valve 9073, cooling fan coil 9065, port 9097*b*, and port 9097*a* in sequence and finally be suctioned into the pump 9093. In this mode, the heat absorbed in cooling coil 9013 may be rejected into the room space through cooling fan coil 9065 to heat the space if needed. Whether the extra heat is rejected into the ambient or into a room space depends on the thermal demands and can be selected by the actions of valves 9095 and 9097. In a third model, where subsystem B is a secondary source of cooling, the secondary source for cooling fan coil 9065 is from port 9095*b* (port 9095*a* is connecting with port 9095*b* and port 9095*a* is isolated with port 9095*c*), through inlet 9069 of cooling fan coil 9065. After going through cooling fan coil 9065, the 4$^{th}$ coolant may go into port 9097*b* and port 9097*a* subsequently (port 9097*a* is connecting with port 9097*b* and port 9097*a* is isolated with port 9097*c*) and is eventually suctioned into pump 9093. The 4$^{th}$ coolant in subsystem B can be the same fluid as the 2$^{nd}$ coolant.

Referring to the whole of FIG. 9, the present embodiment comprises five subsystems which are R, B, F H and O. Subsystem R works as the heat source by which the thermal energy can be extracted from the electronic devices, collected by every individual liquid rack 9039, and circulated between subsystem F as a thermal storage tank through 1st coolant manifold 9047 and 1st coolant manifold 9049. The subsystem F with 2$^{nd}$ coolant can at first work as a high-density storage of thermal energy from subsystem R by the inserted phase change material 9023 and may also work as a passive thermal stabilizer to remove the temperature fluctuation from subsystem R caused by the IT load variation, which improves performances of the system for the thermal user. Thirdly, subsystem F can work as an energy distributor in adoption of different combinations of thermal usages. Subsystem B is a Heat dissipation subsystem with a 3$^{rd}$ coolant in the case of where overheating occurs in subsystem F. If overheating is detected in subsystem F, subsystem B can start working to throw extra heat to ambient through dry cooler 9091. Subsystem H works as an active thermal stabilizer, by which the heat pump circulation can counteract the variation from subsystem R. The heat capacity through the wall of condenser coil 9005 can be modulated by compressor 9051 driven by a variable speed driver, for the temperature setting of the 2$^{nd}$ coolant. Meanwhile, the cooling capacity through the wall of the heat exchanger 9053 can cool the 4$^{th}$ coolant, which may eventually be used for indoor environmental temperature control. By this approach, complete heat reuse may be realized by the avail of condensing heat for active thermal stabilizing in subsystem F and evaporating cool for indoor environmental control in subsystem O. Subsystem O represents thermal end user with requirements of heating and cooling capacity by heat fan coil 9079 and cooling fan coil 9065 respectively.

The variation mismatch between the output of subsystem R and the requirement from subsystem O almost always exists. The temperature fluctuations from subsystem R come from the IT load variation of the operational data center, which is unavoidable. In contrast, the demands from the end user of the resulting thermal energy require the supply temperature to be as stable as possible. The thermal energy from subsystem R whose variation relies on the IT load fluctuation is in nature hard to match the air conditioning load variation in subsystem determined mainly by human behaviors, in terms of its frequency and amplitude. This contradiction between supply and demand makes a stabilizer desirable if not necessary for the reliable operation of a heat reuse system in accordance with an embodiment of the present invention as the heat cannot be effectively reused without a stable temperature output. In addition, the active thermal stabilizer system can stabilize the temperature of the 2$^{nd}$ coolant by modulating the speed of compressor 9037 while the cooling capacity generated by compressor 9037 may be used to cool subsystem O. The phase change material 9023 can work as a passive thermal stabilizer, by its large latent heat of phase change at constant temperature. Passive and active thermal stabilizers can work separately or together for the purpose of maintaining a stable temperature of the 2$^{nd}$ coolant within subsystem R. Another possible mechanism to stabilize the temperature of the 2$^{nd}$ coolant when the thermal demands from subsystem O are very low is to dissipate the additional heat to the ambient environment through subsystem B. When subsystem B is working for heat rejection to the ambient environment, subsystem H must not work for energy saving if there is no cooling demand from subsystem O.

Figure 10:
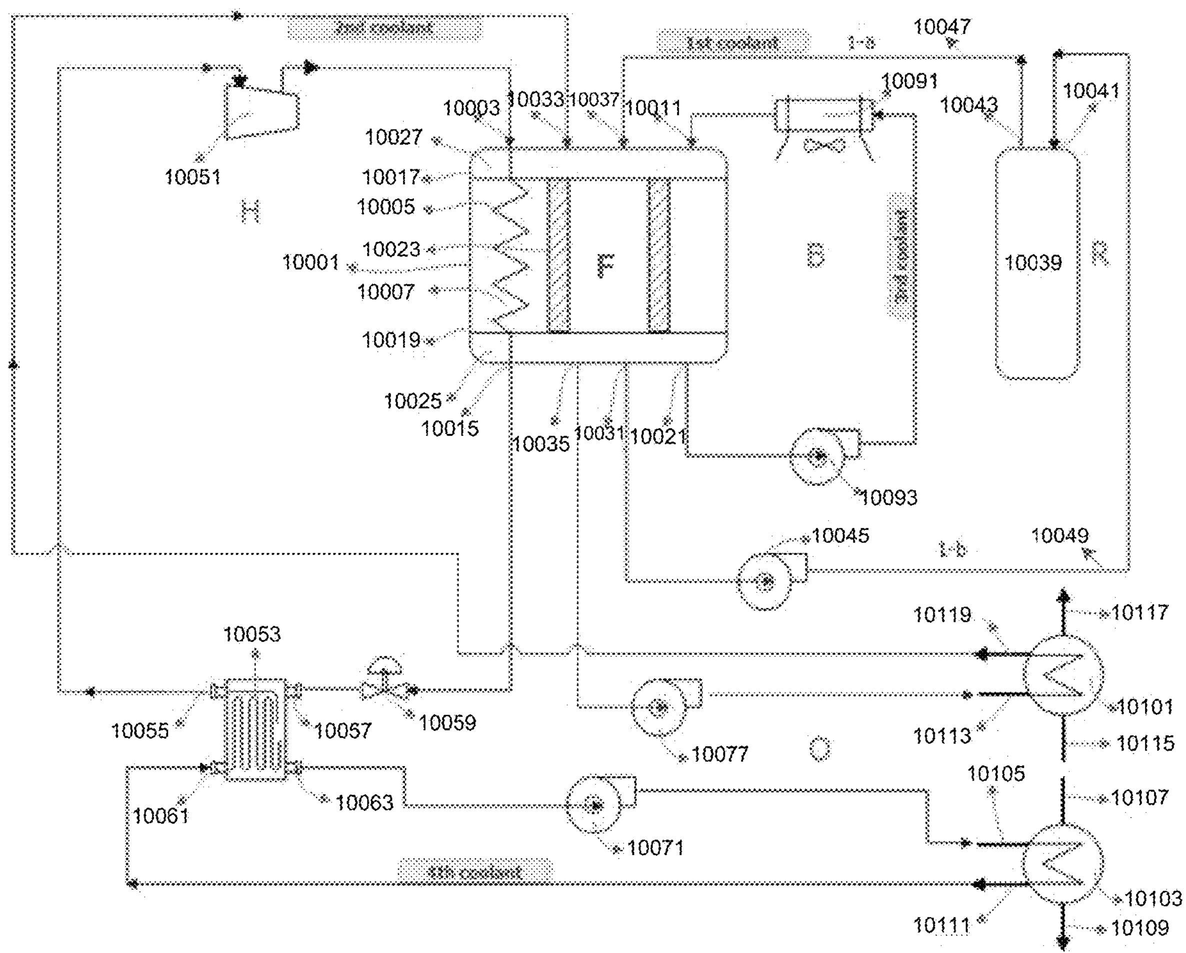
FIG. 10 is a systemic diagram of an exemplary data center heat reuse system 10000, in accordance with an embodiment of the present invention.

FIG. 10 is a systemic diagram of an exemplary data center heat reuse system 10000, in accordance with an embodiment of the present invention. The present embodiment is a simplified version of the embodiment illustrated by way of example in FIG. 9. In the present embodiment, the system is configured without a cooling coil from subsystem B and without a heat coil from subsystem F. As a result, a 1$^{st}$ coolant in in subsystem R, a 3$^{rd}$ coolant in subsystem B, and a 2$^{nd}$ coolant in a volume 10007 of a thermal storage tank 10001 and in subsystem H can all be the same fluid. A cooling inlet 10011, an inlet plenum port 10033, and a heating inlet 10037 may all be connected with an inlet plenum 10027. A cooling outlet 10021 coil, an outlet plenum port 10031, and a heating outlet 10035 may be connected with an outlet plenum 10025. A refrigerant inlet 10003 and refrigerant outlet 10015 may be connected with a condenser coil 10005 internally so that the refrigerant can flow from refrigerant inlet 10003 into condenser coil 10005 out from refrigerant outlet 10015. As the refrigerant flows through condenser coil 10005, the heat in the refrigerant can be rejected from the refrigerant into the 2$^{nd}$ coolant in the internal volume 10007 of 2$^{nd}$ coolant through the wall of condenser coil 10005. Phase change material 10023 that may be encapsulated into the beam, ball or other geometrical volumes may be held in the internal volume 10007 of 2$^{nd}$ coolant. 2nd coolant distribution plates 10017 and 10019 may function to distribute the flow of 2$^{nd}$ coolant evenly through phase change material 10023. Thermal storage tank 10001 is preferably insulated.

Referring to subsystem B, a cooling water circulation pump 10093 can suction the 3$^{rd}$ coolant from the cooling outlet 10021. After passing through a dry cooler 10091, the 2$^{nd}$ coolant flows back to thermal storage tank 10001 through cooling inlet 10011. The 1$^{st}$ coolant from liquid rack 10039 flows into the inlet plenum 10027 through heating inlet 10037 and may be suctioned into a liquid rack 1st coolant circulation pump 10045 through cooling outlet 10021 from outlet plenum 10015. The 2$^{nd}$ coolant exiting heating outlet 10035 may be suctioned by a 2$^{nd}$ coolant circulation pump 10077, and, after being cooled down a heating heat exchanger 10101, the 2$^{nd}$ coolant flows back to thermal storage tank 10001 through inlet plenum port 10033. The purpose of subsystem B is to dissipate the extra heat into the ambient through dry cooler 10091, when the total heat supply from subsystem R and subsystem H is above the demands from subsystem O. The 3$^{rd}$ coolant (in this case the 1$^{st}$ coolant is the same as the 3$^{rd}$ coolant) is pumped into internal volume 10007 through inlet 10011 and flows out through outlet 10021. In this situation, the over-heated $3^{rd}$ coolant may be cooled by the cold air in the ambient through dry cooler 10091.

In the present embodiment, subsystem R refers to the subsystem of liquid cooling in the data center. The hot $1^{st}$ coolant heated by the thermal energy being extracted from the electronic devices flows out of an outlet port 10043 then may be collected by a $1^{st}$ coolant manifold 10047. The $1^{st}$ coolant out of manifold 10047 may flow into internal volume 10007, in which the $2^{nd}$ coolant is the same fluid as the $1^{st}$ coolant. The $1^{st}$ coolant exiting internal volume 10007 through outlet 10031 may then be suctioned into liquid rack 1st coolant circulation pump 10045 and then be pumped into a $1^{st}$ coolant manifold 10047 back into liquid cooling rack 10039 through a $1^{st}$ coolant inlet 10041 of liquid rack 10039. Those skilled in the art will readily recognize that subsystem R may be implemented with more than one cooling rack.

Referring to subsystem H, this system typically works as a heat pump by the principle of a refrigeration cycle. A compressor 10051 driven by variable speed driver compresses the superheated refrigerant into a condenser coil 10005 submerged in the s $2^{nd}$ coolant within internal volume 10007 of thermal storage tank 10001 where the condensing heat may be rejected from condenser coil 10005 into the $2^{nd}$ coolant. The condensed liquid out of condenser coil 10005 may then be throttled by an expansion valve 10059 and move on to the evaporating side of a heat exchanger 10053 through an inlet 10057 where the refrigerant can absorb the heat from the other side of heat exchanger 10053, in which a $4^{th}$ coolant may flow from an inlet 10061 to heat exchanger 10053 to outlet 10063. The evaporated vapor of the refrigerant may exit heat exchanger 10053 through outlet 10055 to be suctioned into compressor 10051 to form a complete cycle, in which the heat absorbed in the heat exchanger 10053 may be pumped to $2^{nd}$ coolant in the internal volume 10007 of the thermal storage tank 10001.

In the present embodiment, subsystem O mimics a real load scenario which requires heating and cooling simultaneously or separately. A cooling heat exchanger 10103 may provide cooling capacity to external users in subsystem O, and heating heat exchanger may provide heating capacity to external users in subsystem O. The coupling of cooling heat exchanger 10103 and heating heat exchanger may enable the system to provide the heating and cooling simultaneously. The cold $4^{th}$ coolant from heat exchanger 10053 may be suctioned by a circulation pump 10071 out through outlet 10063 of heat exchanger 10053 and driven through an inlet 10105 of cooling heat exchanger 10103. Inside cooling heat exchanger 10103, the heat exchange may happen between an inlet side with inlet 10105 and an outlet side 10109 with an outlet 10111, in which heated fluid flowing from inlet side 10107 to outlet side 10109 is cooled down by rejecting its heat into the $4^{th}$ coolant flowing through a coil in cooling heat exchanger 10103. The now heated $4^{th}$ coolant exits cooling heat exchanger 10103 through outlet 10111 to be pumped back into inlet 10061 of heat exchanger 10053 to form a closed loop circulation. Similarly, the $2^{nd}$ coolant out of outlet 10035 of thermal storage tank 9001 may be suctioned into the $2^{nd}$ coolant circulation pump 10077. In this case, the $2^{nd}$ coolant is the same as the $4^{th}$ coolant. The heated $2^{nd}$ coolant may be pumped into heating heat exchanger 10101 through an inlet 10113. The heat in the $2^{nd}$ coolant may be rejected into cool fluid flowing from an inlet side 10115 of heating heat exchanger 10101 to an outlet side 10117 side. The $2^{nd}$ coolant exiting an outlet 10119 of heating heat exchanger 10101 may be pushed back to internal volume 10007 of thermal storage tank 10001 through inlet plenum port 10033. It is contemplated that this loop can realize the transfer of heat from Subsystem R to an external user through the flow at the outlet side 10117 of heating heat exchanger 10101. Those skilled in the art will recognize that cooling heat exchanger 10103 and heating heat exchanger 10101 may be virtually any type of heat exchanger that can provide effective heat transferring between the inlet side and the outlet side.

Referring to the embodiment illustrated by way of example in FIG. 10 as a relatively simple version, the heating heat exchanger 10101 and cooling heat exchanger 10103 can be the heat resource and cold resource for external equipment respectively. Some non-limiting examples of typical applications of the system as the heat resource include, without limitation, space heating, preheating of a boiler, the primary stage of a heat pump, the generator of an absorption/adsorption chiller, etc. Non-limiting examples of typical applications as a cold resource include, without limitation, space cooling, precooling of equipment, dehumidifying, cooling any other equipment, etc. Some features of this basic version include, without limitation, that the heat from server rack 10039 can be collected and then transferred to subsystem F that extra thermal energy may be dissipated into the ambient by subsystem B, that subsystem H may work as an active stabilizer and booster if needed to maintain the coolant temperature as desired while the cooling capacity from subsystem H can be reused by external equipment. As for subsystem F, the phase change material 10023 has the potential to provide high latent heat to enhance the energy storage density.

Figures 11A, 11B:
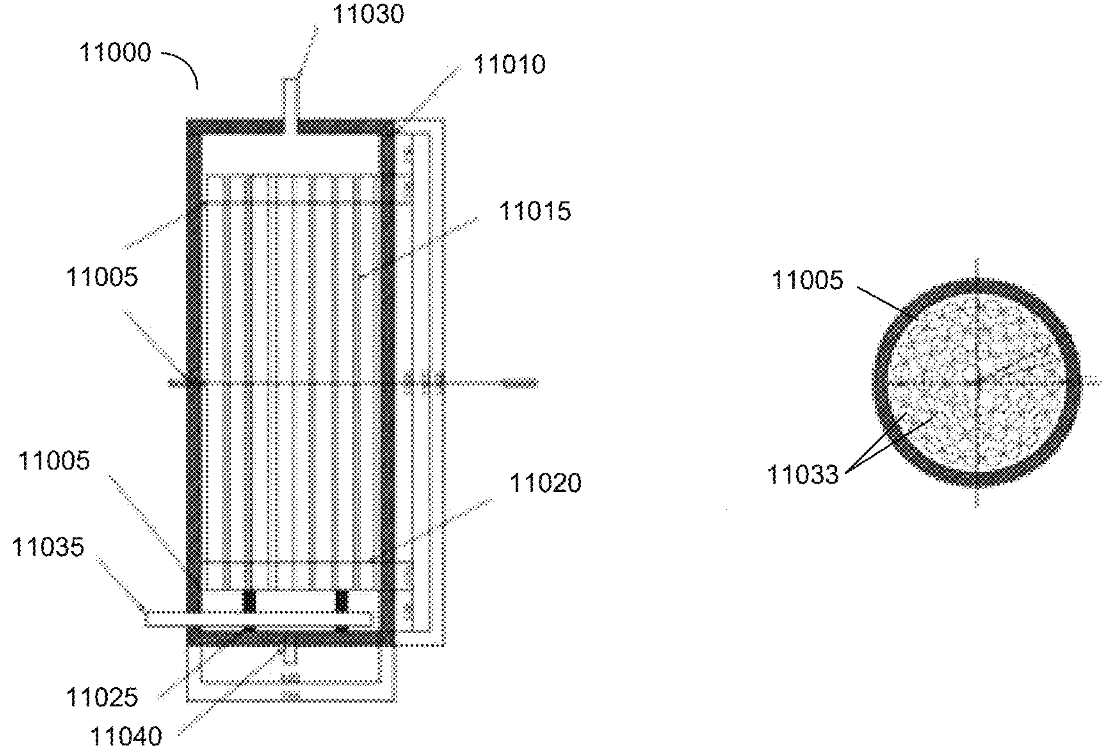
FIG. 11A and FIG. 11B illustrate an exemplary phase change material thermal storage tank, in accordance with an embodiment of the present invention.

FIG. 11A and FIG. 11B illustrate an exemplary phase change material thermal storage tank 11000, in accordance with an embodiment of the present invention. FIG. 11A is a cross-sectional side view, and FIG. 11B is a top view of a distributor 11005. In the present example, the phase change material is being capsulated in cylindrical pipes 11015. The tank will be thermally insulated by an insulation layer 10010 that may comprise a multiplicity of suitable insulating materials such as, but not limited to lightweight composites like fiberglass, mineral wool, silica, cellulose, ceramics, etc. and foam insulation materials like polystyrene, melamine, polyurethane, closed cell, polyimide, etc. Pipes 11015 filled with phase change material may be installed vertically in the tank within a pipe frame 11020 and supported by a support base 11025. Depending on the configuration of the tank, similar pipes may be installed horizontally alternate implementations of similar thermal storage tanks. In typical use of the present embodiment, the working fluid will flow into tank 11000 at an inlet pipe 11030, through holes 11033 in distributors 11005 to obtain an evenly distributed flow across pipes 11015, and out the tank at a return pipe 11035. A drainage pipe 11040 may enable the tank to be drained for various reasons such as, but not limited to, cleaning, configuration changes, etc. The density and configuration of pipes 11015 can be adjusted by the requirements of heat load. Furthermore, extra coils can be inserted into tank 11000 as the surface of heat exchange, such as, but not limited to, cooling coils, heating coils, condensing coils, etc. As previously noted, alternate embodiments may be implemented with phase change materials encapsulated in a multiplicity of suitable forms such as, but not limited to spheres, rectangular bars, coils, etc. Furthermore, it is contemplated that various different types of phase change materials may be used in different implementations depending on the requirements of the system and the thermal properties of the phase change materials. For example, if the waste heat from the computer server is used in a district heating system, a suitable phase change temperature may be around 62° C., regarding its normal working temperature. If the waste heat will be used to heat hygienic water, 53° C. may be a suitable temperature. Concerning the different thermal properties of phase change materials, the thermal design and mechanical design must be done according to the needs of heat load, pressure drop, and other critical parameters. Although 1$^{st}$, 2$^{nd}$, 3$^{rd}$, and 4$^{th}$ coolants have been referred to in the descriptions corresponding to FIG. 9 and FIG. 10, coolants may be selected as a water-based glycol solution based on their working temperature. 1$^{st}$ and 2$^{nd}$ coolants can be pure water depending on their installation location. 3rd and 4th coolants can be the glycol solution based on the exposed ambient temperature. Those skilled in the art, in light of the teachings of the present invention will recognize that a multiplicity of suitable liquids may be used as the coolants in systems according to embodiments of the present invention.

It is contemplated that there are various potential benefits of heat reuse systems according to embodiments of the present invention including, without limitation, providing a storage tank integrated with a temperature stabilizer for a stable temperature supply to the end user, providing passive phase change energy storage and an active heat pump temperature stabilizing mechanisms, a configuration that allows thermal exchange among heat sources to occur in the storage tank instead of in serial or parallel mode, providing heating and cooling simultaneously, allowing for a compact size due to the phase change material involved, high energy efficiency, etc.

Those skilled in the art will readily recognize, in light of and in accordance with the teachings of the present invention, that any of the foregoing steps may be suitably replaced, reordered, removed and additional steps may be inserted depending upon the needs of the particular application. Moreover, the prescribed method steps of the foregoing embodiments may be implemented using any physical and/or hardware system that those skilled in the art will readily know is suitable in light of the foregoing teachings. For any method steps described in the present application that can be carried out on a computing machine, a typical computer system can, when appropriately configured or designed, serve as a computer system in which those aspects of the invention may be embodied.

All the features disclosed in this specification, including any accompanying abstract and drawings, may be replaced by alternative features serving the same, equivalent, or similar purpose, unless expressly stated otherwise. Thus, unless expressly stated otherwise, each feature disclosed is one example only of a generic series of equivalent or similar features.

It is noted that according to USA law 35 USC § 112 (1), all claims must be supported by sufficient disclosure in the present patent specification, and any material known to those skilled in the art need not be explicitly disclosed. However, 35 USC § 112 (6) requires that structures corresponding to functional limitations interpreted under 35 USC § 112 (6) must be explicitly disclosed in the patent specification. Moreover, the USPTO's Examination policy of initially treating and searching prior art under the broadest interpretation of a "mean for" or "steps for" claim limitation implies that the broadest initial search on 35 USC § 112(6) (post AIA 112(f)) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC § 112(6) (post AIA 112(f)) when such corresponding structures are not explicitly disclosed in the foregoing patent specification. Therefore, for any invention element(s)/structure(s) corresponding to functional claim limitation(s), in the below claims interpreted under 35 USC § 112(6) (post AIA 112(f)), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed. Applicant(s) request(s) that fact finders during any claims construction proceedings and/or examination of patent allowability properly identify and incorporate only the portions of each of these documents discovered during the broadest interpretation search of 35 USC § 112(6) (post AIA 112(f)) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-892 or likewise any information disclosure statements (IDS) entered into the present patent application by the USPTO or Applicant(s) or any 3$^{rd}$ parties. Applicant(s) also reserves its right to later amend the present application to explicitly include citations to such documents and/or explicitly include the functionally corresponding structures which were incorporated by reference above.

Thus, for any invention element(s)/structure(s) corresponding to functional claim limitation(s), in the below claims, that are interpreted under 35 USC § 112(6) (post AIA 112(f)), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC § 112 (6). Applicant(s) note that all the identified documents above which are incorporated by reference to satisfy 35 USC § 112 (6) necessarily have a filing and/or publication date prior to that of the instant application, and thus are valid prior documents to incorporated by reference in the instant application.

Having fully described at least one embodiment of the present invention, other equivalent or alternative methods of implementing systems for the reuse of heat in a data center according to the present invention will be apparent to those skilled in the art. Various aspects of the invention have been described above by way of illustration, and the specific embodiments disclosed are not intended to limit the invention to the particular forms disclosed. The particular implementation of the heat reuse systems may vary depending upon the particular context or application. By way of example, and not limitation, the cooling systems described in the foregoing were principally directed to implementations meant to cool data servers; however, similar techniques may instead be applied to other types of applications such as, but not limited to, batteries in electric vehicles, other systems with large batteries, manufacturing settings, and mechanical systems utilizing that generate large amounts of heat, which implementations of the present invention are contemplated as within the scope of the present invention. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The Abstract is provided to comply with 37 C.F.R. Section 1.72(b) requiring an abstract that will allow the reader to ascertain the nature and gist of the technical disclosure. That is, the Abstract is provided merely to introduce certain concepts and not to identify any key or essential features of the claimed subject matter. It is submitted with the understanding that it will not be used to limit or interpret the scope or meaning of the claims.

The following claims are hereby incorporated into the detailed description, with each claim standing on its own as a separate embodiment.

Only those claims which employ the words "means for" or "steps for" are to be interpreted under 35 USC 112, sixth paragraph (pre-AIA) or 35 USC 112(f) post-AIA. Otherwise, no limitations from the specification are to be read into any claims, unless those limitations are expressly included in the claims.

What is claimed is:

1. A thermal management system for a data center, comprising:

a thermal storage tank defining an internal coolant volume containing a liquid coolant;

a data center cooling loop, coupled to the data center and the thermal storage tank, configured to deliver heated data center coolant to the thermal storage tank and deliver cooled data center coolant to the data center;

a heating coil disposed within and immersed in the internal coolant volume and thermally coupled to the data center cooling loop;

a condenser coil disposed within and immersed in the internal coolant volume and thermally coupled to a heat pump;

a cooling coil disposed within and immersed in the internal coolant volume and thermally coupled to a heat dissipation subsystem;

a passive stabilizer comprising encapsulated phase change material disposed within the internal coolant volume and configured to absorb temperature fluctuation of the liquid coolant through latent heat of phase change; and an active stabilizer comprising the heat pump, coupled to the thermal storage tank, configured to modify the liquid coolant to a modified temperature meeting a temperature stabilization requirement, wherein thermal exchange between the data center cooling loop, the heat pump, and the heat dissipation subsystem occurs within the internal coolant volume of the thermal storage tank; and wherein the heat pump is configured to provide a fluctuation-mitigating thermal capacity sufficient to counteract temperature variation of the liquid coolant rather than to handle a full thermal load of the data center.

2. The thermal management system of claim 1, wherein a temperature of the heated data center coolant varies based on a data processing load of computing devices within the data center.

3. The thermal management system of claim 1, wherein the thermal storage tank comprises an insulation layer.

4. The thermal management system of claim 1, wherein the passive stabilizer is configured to maintain a temperature of the liquid coolant.

5. The thermal management system of claim 1, wherein the thermal storage tank includes an inlet plenum and an outlet plenum configured to distribute the liquid coolant across the heating coil, condenser coil, cooling coil, and encapsulated phase change material.

6. The thermal management system of claim 5, wherein the phase change temperature and the stabilization requirement are based on waste heat needs for an end user of thermal energy.

7. The thermal management system of claim 6, further comprising:

a cooling heat exchanger, coupled to the thermal storage tank, configured to provide cooling capacity to a district heating system; and a heating heat exchanger, coupled to the thermal storage tank, configured to provide heating capacity to the district heating system.

8. The thermal management system of claim 7, wherein a cooling capacity and a heating capacity are simultaneously provided to the district heating system.

9. The thermal management system of claim 1, wherein the heat pump is configured to boost a temperature of the liquid coolant to meet the stabilization requirement.

10. The thermal management system of claim 1, wherein the heat pump comprises:

a compressor; and a variable speed driver, coupled to the compressor, wherein the variable speed driver is modulated based on an outlet temperature of the thermal storage tank.

11. The thermal management system of claim 10, wherein the compressor is configured to compress a superheated refrigerant within the condenser coil to heat the liquid coolant.

12. The thermal management system of claim 1, wherein the active stabilizer comprises a cooling system configured to dissipate extra heat in the thermal storage tank.

13. The thermal management system of claim 12, comprising:

a dry cooler, configured to dissipate the extra heat to the ambient; and a pump, coupled to the dry cooler, configured to be activated in response to a temperature of the liquid coolant is above the stabilization requirement.

14. The thermal management system of claim 13, comprising:

a cooling coil, coupled to the dry cooler, configured to absorb heat from the liquid coolant in response to the pump being activated.

15. A method for thermally managing a data center, comprising:

circulating data center coolant through a data center cooling loop coupled to the data center and a thermal storage tank defining an internal coolant volume and containing a liquid coolant, including delivering heated data center coolant to the thermal storage tank and delivering cooled data center coolant to the data center;

thermally exchanging heat between the data center cooling loop and the liquid coolant through a heating coil disposed within and immersed in the internal coolant volume and thermally coupled to the data center cooling loop;

absorbing temperature fluctuation of the liquid coolant, by a passive stabilizer, through latent heat of phase change;

thermally exchanging heat between a heat pump and the liquid coolant through a condenser coil disposed within and immersed in the internal coolant volume and thermally coupled to the heat pump;

thermally exchanging heat between a heat dissipation subsystem and the liquid coolant through a cooling coil disposed within and immersed in the internal coolant volume and thermally coupled to the heat dissipation subsystem;

modifying, by an active stabilizer comprising the heat pump and coupled to the thermal storage tank, the liquid coolant to a modified temperature meeting a temperature stabilization requirement;

wherein thermal exchange between the data center cooling loop, the heat pump, and the heat dissipation subsystem occurs within the internal coolant volume of the thermal storage tank; and wherein the heat pump provides a fluctuation-mitigating thermal capacity sufficient to counteract temperature variation of the liquid coolant rather than to handle a full thermal load of the data center.

16. The method of claim 15, wherein the passive stabilizer comprises encapsulated phase change material disposed within the internal coolant volume.

17. The method of claim 16, wherein the compressor, the variable speed driver, and the dry cooler are coupled to the thermal storage tank.

18. The method of claim 15, wherein modifying the liquid coolant to the modified temperature of the data center coolant comprises:

in response to a data center coolant temperature is above the stabilization requirement, modulating by a dry cooler, the data center coolant temperature to meet the stabilization requirement; and in response to the data center coolant temperature is below the stabilization requirement, modulating by a variable speed driver and a compressor, the data center coolant temperature to meet the stabilization requirement, wherein the variable speed driver and the compressor comprises the heat pump.

19. The method of claim 18, wherein the dry cooler dissipates extra heat to ambient air.

20. The method of claim 18, wherein a cooling heat exchanger and a heating heat exchanger simultaneously provide the liquid coolant at the modified temperature for use outside the data center.

* * * * *